United States Patent
Matsudai et al.

(10) Patent No.: US 10,903,346 B2
(45) Date of Patent: Jan. 26, 2021

(54) TRENCH-GATE SEMICONDUCTOR DEVICE HAVING FIRST AND SECOND GATE PADS AND GATE ELECTRODES CONNECTED THERETO

(71) Applicants: Kabushiki Kaisha Toshiba, Tokyo (JP); Toshiba Electronic Devices & Storage Corporation, Tokyo (JP)

(72) Inventors: Tomoko Matsudai, Tokyo (JP); Tsuneo Ogura, Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/137,763

(22) Filed: Sep. 21, 2018

(65) Prior Publication Data
US 2019/0296134 A1    Sep. 26, 2019

(30) Foreign Application Priority Data
Mar. 23, 2018  (JP) ................. 2018-055402

(51) Int. Cl.
*H01L 29/739* (2006.01)
*H01L 29/423* (2006.01)
(Continued)

(52) U.S. Cl.
CPC ...... *H01L 29/7397* (2013.01); *H01L 29/0619* (2013.01); *H01L 29/407* (2013.01); *H01L 29/4236* (2013.01); *H01L 29/4238* (2013.01)

(58) Field of Classification Search
CPC .......... H01L 29/7397; H01L 29/66348; H01L 29/407; H01L 29/0619–0623
See application file for complete search history.

(56) References Cited

U.S. PATENT DOCUMENTS 6,114,727 A * 9/2000 Ogura ................. H01L 29/0696
257/212
8,716,747 B2  5/2014 Saito et al.
(Continued)

FOREIGN PATENT DOCUMENTS

JP    2011-181886 A    9/2011
JP    2013-098415 A    5/2013
(Continued)

OTHER PUBLICATIONS

M. Sumitomo, et al., "Injection Control Technique for High Speed Switching with a double gate PNM-IGBT," 25th International Symposium on Power Semiconductor Devices & ICs, Kanazawa, 2013, pp. 33-36.

*Primary Examiner* — Younes Boulghassoul
(74) *Attorney, Agent, or Firm* — White & Case LLP

(57) ABSTRACT

A semiconductor device according to an embodiment includes a semiconductor layer having a first plane and a second plane; an emitter electrode provided on a first plane side of the semiconductor layer; a collector electrode provided on a second plane side of the semiconductor layer; a first gate electrode pad provided on the first plane side; a second gate electrode pad provided on the first plane side; a cell region including a first trench provided in the semiconductor layer and a first gate electrode that is provided in the first trench and is connected to the first gate electrode pad; and a cell end region that is adjacent to the cell region and includes a second trench provided in the semiconductor layer and a second gate electrode which is provided in the second trench and is connected to the second gate electrode pad.

16 Claims, 17 Drawing Sheets

(51) Int. Cl.
*H01L 29/06* (2006.01)
*H01L 29/40* (2006.01)

(56) References Cited

U.S. PATENT DOCUMENTS

| | | | |
|---|---|---|---|
| 10,062,753 B2 | 8/2018 | Kouno | |
| 2011/0193132 A1 | 8/2011 | Kouno et al. | |
| 2013/0328105 A1* | 12/2013 | Matsuura | H01L 29/0696 257/139 |
| 2014/0084337 A1* | 3/2014 | Matsudai | H01L 29/36 257/140 |
| 2014/0209972 A1* | 7/2014 | Sumitomo | H01L 29/4238 257/140 |
| 2015/0014741 A1* | 1/2015 | Chen | H01L 29/4236 257/139 |
| 2015/0129927 A1 | 5/2015 | Sumitomo et al. | |
| 2015/0311285 A1* | 10/2015 | Momota | H01L 29/4238 257/139 |
| 2016/0352326 A1* | 12/2016 | Laven | H01L 27/0727 |
| 2017/0250269 A1* | 8/2017 | Sumitomo | H01L 27/04 |
| 2018/0076309 A1* | 3/2018 | Philippou | H01L 29/866 |
| 2018/0301549 A1* | 10/2018 | Takeuchi | H03K 17/08128 |
| 2018/0323294 A1* | 11/2018 | Okuda | H01L 29/4238 |
| 2019/0097004 A1* | 3/2019 | Ina | H01L 29/7811 |
| 2019/0115436 A1* | 4/2019 | Hossain | H01L 29/0696 |
| 2019/0148364 A1 | 5/2019 | Kono | |
| 2019/0148365 A1* | 5/2019 | Kono | H01L 29/7397 257/140 |
| 2019/0221658 A1* | 7/2019 | Yoneda | H01L 29/1095 |
| 2019/0237545 A1* | 8/2019 | Suzuki | H01L 29/0615 |
| 2019/0252534 A1* | 8/2019 | Murakawa | H01L 27/0727 |
| 2019/0296133 A1* | 9/2019 | Iwakaji | H01L 21/765 |
| 2019/0386131 A1* | 12/2019 | Takeuchi | H01L 21/0495 |
| 2020/0058645 A1* | 2/2020 | Harada | H01L 27/0727 |
| 2020/0083879 A1* | 3/2020 | Tanaka | H01L 27/04 |

FOREIGN PATENT DOCUMENTS

| | | |
|---|---|---|
| JP | 2018-14419 A * | 1/2018 |
| WO | 2013179648 A1 | 12/2013 |

* cited by examiner

TERMINATION REGION 103

TRENCH-GATE SEMICONDUCTOR DEVICE HAVING FIRST AND SECOND GATE PADS AND GATE ELECTRODES CONNECTED THERETO

CROSS-REFERENCE TO RELATED APPLICATION

This application is based upon and claims the benefit of priority from Japanese Patent Application No. 2018-055402, filed on Mar. 23, 2018, the entire contents of which are incorporated herein by reference.

FIELD

Embodiments described herein relate generally to semiconductor devices.

BACKGROUND

An insulated gate bipolar transistor (IGBT) is one example of a power semiconductor device. In the IGBT, for example, a p-type collector region, an n-type drift region, and a p-type base region are provided on a collector electrode. And, a gate electrode is provided in a trench that penetrate through the p-type base region and reaches the n-type drift region, with a gate insulating film interposed between the gate electrode and the trench. In addition, an n-type emitter region connected to an emitter electrode is provided in a region that is adjacent to the trench in the surface of the p-type base region.

In the IGBT, a positive voltage higher than a threshold voltage is applied to the gate electrode to form a channel in the p-type base region. Then, electrons are injected from the n-type emitter region to the n-type drift region and holes are injected from the p-type collector region to the n-type drift region. Then, a current having the electrons and the holes as carriers flows between the collector electrode and the emitter electrode.

A region in which the channel is formed in the IGBT is defined as a cell region (or a cell). In this case, in an end portion of the cell region of the IGBT, for example, in a boundary region between a termination region and the cell region, the carriers are spread to a region in which no cell is present when the IGBT in an on state. During a turn-off operation in which the IGBT changes from an on state to an off state, the spread carriers are concentrated on a cell close to the end portion of the cell region and are then discharged. Therefore, current density increases locally. As a result, there is a concern that the destruction of the IGBT will occur.

DETAILED DESCRIPTION

Figure 1:
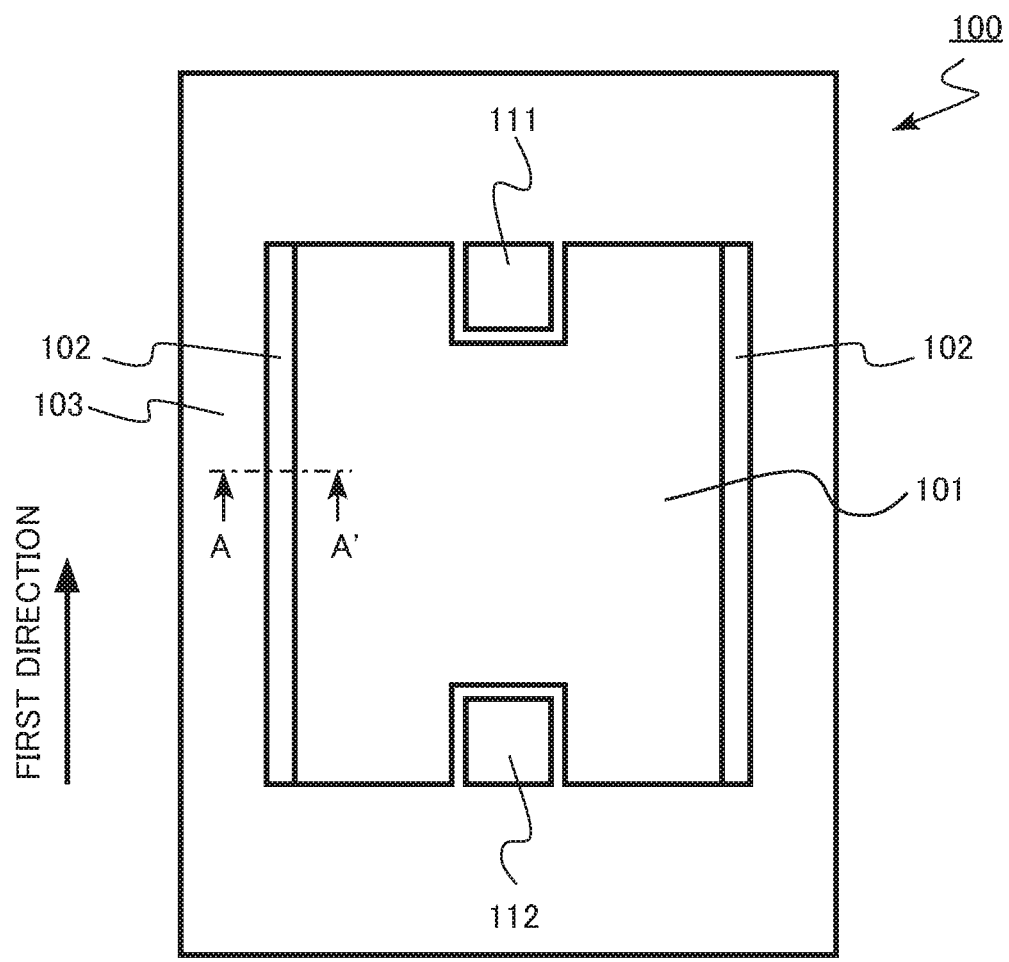
FIG. 1 is a plan view schematically illustrating a semiconductor device according to a first embodiment.

A semiconductor device according to an embodiment includes: a semiconductor layer having a first plane and a second plane opposite to the first plane; an emitter electrode provided on a side of the first plane of the semiconductor layer; a collector electrode provided on a side of the second plane of the semiconductor layer; a first gate electrode pad provided on the side of the first plane of the semiconductor layer; a second gate electrode pad provided on the side of the first plane of the semiconductor layer; a cell region including at least one first trench provided in the semiconductor layer and a first gate electrode provided in the at least one first trench, the first gate electrode being electrically connected to the first gate electrode pad; and a cell end region including at least one second trench provided in the semiconductor layer and a second gate electrode provided in the at least one second trench, the second gate electrode being electrically connected to the second gate electrode pad, the cell end region being adjacent to the cell region.

Hereinafter, embodiments of the invention will be described with reference to the drawings. In the following description, for example, the same parts are denoted by the same reference numerals and the description of the parts that have been described once will not be repeated.

In the specification, in a case in which conductivity types are represented by $n^+$, n, and $n^-$, $n^+$ indicates the highest n-type impurity concentration, followed by n and $n^-$. In addition, in a case in which conductivity types are represented by $p^+$, p, and $p^-$, $p^+$ indicates the highest p-type impurity concentration, followed by p and $p^-$.

First Embodiment

A semiconductor device according to a first embodiment includes a semiconductor layer having a first plane and a second plane opposite to the first plane; an emitter electrode provided on the first plane of the semiconductor layer; a collector electrode provided on the second plane of the semiconductor layer; a first gate electrode pad provided on the first plane of the semiconductor layer; a second gate electrode pad provided on the first plane of the semiconductor layer; a cell region including a first trench provided in the semiconductor layer and a first gate electrode provided in the first trench, the first gate electrode being electrically connected to the first gate electrode pad; and a cell end region including a second trench provided in the semiconductor layer and a second gate electrode provided in the second trench, the second gate electrode being electrically connected to the second gate electrode pad, the cell end region being adjacent to the cell region.

Figure 2:
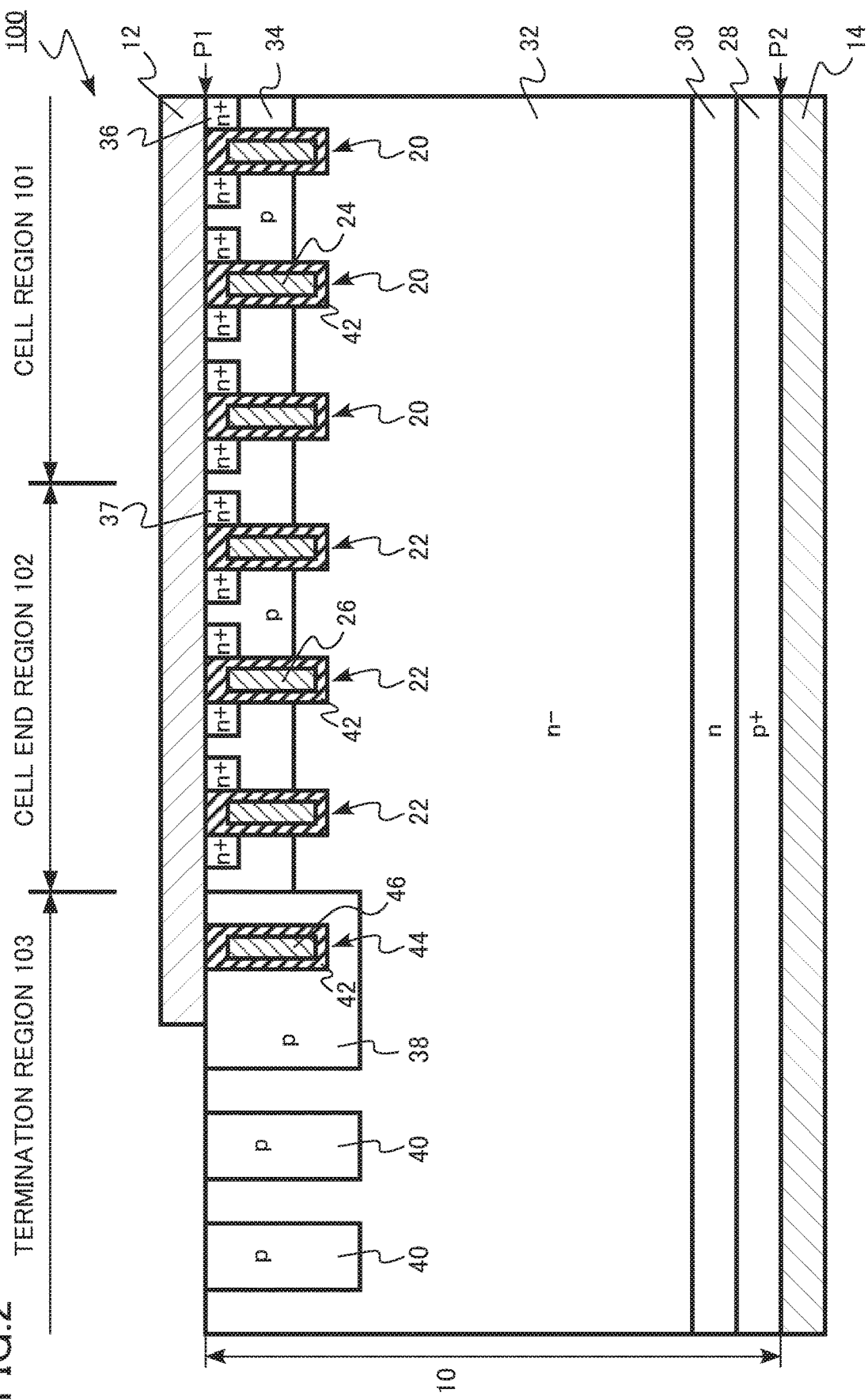
FIG. 2 is a cross-sectional view schematically illustrating the semiconductor device according to the first embodiment.

FIG. 1 is a plan view schematically illustrating the semiconductor device according to the first embodiment. FIG. 2 is a cross-sectional view schematically illustrating the semiconductor device according to the first embodiment. FIG. 2 is a cross-sectional view taken along the line AA' of FIG. 1. Hereinafter, a case in which a first conductivity type is a p type and a second conductivity type is an n type will be described as an example.

The semiconductor device according to the first embodiment is a trench gate IGBT 100 in which a gate electrode is provided in a trench formed in a semiconductor layer. Hereinafter, a case in which the first conductivity type is a p type and the second conductivity type is an n type will be described as an example.

The IGBT 100 according to the first embodiment includes a cell region 101, a cell end region 102, a termination region 103, a first gate electrode pad 111, and a second gate electrode pad 112. The IGBT 100 includes a semiconductor layer 10, an emitter electrode 12, and a collector electrode 14.

The semiconductor layer 10 includes a main trench 20 (first trench), a control trench 22 (second trench), a main gate electrode 24 (first gate electrode), a control gate electrode 26 (second gate electrode), a p-type collector region 28 (collector region), an n-type buffer region 30, an n-type drift region 32 (drift region), a p-type base region 34 (base region), a first n-type emitter region 36 (first emitter region), a second n-type emitter region 37 (second emitter region), a p-type peripheral region 38, a p-type guard ring region 40, a gate insulating film 42, a peripheral trench 44, and a trench electrode 46.

The semiconductor layer 10 has a first plane P1 and a second plane P2 opposite to the first plane P1. The semiconductor layer 10 is made of, for example, single-crystal silicon. The thickness of the semiconductor layer 10 is, for example, equal to or greater than 40 μm and equal to or less than 700 μm.

The emitter electrode 12 is provided on a side of the first plane P1 of the semiconductor layer 10. The emitter electrode 12 covers, for example, the entire cell region 101. At least a portion of the emitter electrode 12 comes into contact with the first plane P1 of the semiconductor layer 10. The emitter electrode 12 is made of, for example, metal. An emitter voltage is applied to the emitter electrode 12. The emitter voltage is, for example, 0 V.

The collector electrode 14 is provided on a side of the second plane P2 of the semiconductor layer 10. At least a portion of the collector electrode 14 comes into contact with the second plane P2 of the semiconductor layer 10. The collector electrode 14 is made of, for example, metal. A collector voltage is applied to the collector electrode 14. The collector voltage is, for example, equal to or greater than 200 V and equal to or less than 6500 V.

The first gate electrode pad 111 is provided on the side of the first plane P1 of the semiconductor layer 10. The first gate electrode pad 111 is electrically connected to the main gate electrode 24 in the cell region 101. A first gate voltage is applied to the first gate electrode pad 111.

The second gate electrode pad 112 is provided on the side of the first plane P1 of the semiconductor layer 10. The second gate electrode pad 112 is electrically connected to the control gate electrode 26 in the cell end region 102. A second gate voltage is applied to the second gate electrode pad 112.

The cell end region 102 is provided at the end of the cell region 101. The cell end region 102 is provided so as to be adjacent to the cell region 101. For example, the cell end regions 102 are provided so as to be adjacent to both ends of the cell region 101. The termination region 103 is provided around the cell region 101 and the cell end region 102. The termination region 103 surrounds the cell region 101 and the cell end region 102.

The cell region 101 has a main function of making a current flow in a case in which the IGBT 100 is in an on state. The cell end region 102 has a function of reducing current concentration in a case in which the IGBT 100 is turned off. The termination region 103 has a function of preventing a lowering of the breakdown voltage of the IGBT 100 in a case in which the IGBT 100 is in an off state, that is, a reverse bias is applied.

The cell region 101 includes the emitter electrode 12, the collector electrode 14, the main trench 20, the main gate electrode 24, the p-type collector region 28, the n-type buffer region 30, the n-type drift region 32, the p-type base region 34, the first n-type emitter region 36, and the gate insulating film 42.

The cell end region 102 includes the emitter electrode 12, the collector electrode 14, the control trench 22, the control gate electrode 26, the p-type collector region 28, the n-type buffer region 30, the n-type drift region 32, the p-type base region 34, the second n-type emitter region 37, and the gate insulating film 42.

The termination region 103 includes the emitter electrode 12, the collector electrode 14, the p-type collector region 28, the n-type buffer region 30, the n-type drift region 32, the p-type peripheral region 38, the p-type guard ring region 40, the gate insulating film 42, the peripheral trench 44, and the trench electrode 46.

The p-type collector region 28 is a p$^+$ semiconductor region. The p-type collector region 28 is electrically connected to the collector electrode 14. The p-type collector region 28 comes into contact with the collector electrode 14.

The p-type collector region 28 is a hole supply source in a case in which the IGBT 100 is in an on state.

The n-type buffer region 30 is an n-type semiconductor region. The n-type buffer region 30 is provided between the first plane P1 and the p-type collector region 28. The n-type buffer region 30 has a function of preventing the spread of a depletion layer in a case in which the IGBT 100 is in an off state. The n-type buffer region 30 may be omitted.

The n-type drift region 32 is an n$^-$ semiconductor region. The n-type drift region 32 is provided between the first plane P1 and the n-type buffer region 30. The n-type impurity concentration of the n-type drift region 32 is lower than the n-type impurity concentration of the n-type buffer region 30.

The n-type drift region 32 is the path of an on-current in a case in which the IGBT 100 is in the on state. The n-type drift region 32 has a function of being depleted to maintain the breakdown voltage of the IGBT 100 in a case in which the IGBT 100 is in the off state.

The p-type base region 34 is a p-type semiconductor region. The p-type base region 34 is provided between the first plane P1 and the n-type drift region 32. The depth of the p-type base region 34 in a direction from the first plane P1 to the second plane P2 is, for example, equal to or less than 6 μm. An n-type inversion layer is formed in the p-type base region 34 in a case in which a voltage higher than the threshold voltage of the transistor in the cell region 101 is applied to the main gate electrode 24 and the IGBT 100 is turned on. The p-type base region 34 functions as a channel region of the transistor.

The first n-type emitter region 36 is an $n^+$ semiconductor region. The first n-type emitter region 36 is provided in the cell region 101. The first n-type emitter region 36 is provided between the first plane P1 and the p-type base region 34. The n-type impurity concentration of the first n-type emitter region 36 is higher than the n-type impurity concentration of the n-type drift region 32.

The first n-type emitter region 36 is electrically connected to the emitter electrode 12. The first n-type emitter region 36 comes into contact with the emitter electrode 12. The first n-type emitter region 36 functions as an electron supply source in a case in which the IGBT 100 is in the on state.

The main trench 20 is provided in the cell region 101. The main trench 20 has, for example, a stripe shape that extends in a first direction substantially parallel to the first plane P1.

The main trench 20 penetrates through the p-type base region 34. The depth of the main trench 20 in the direction from the first plane P1 to the second plane P2 is, for example, equal to or less than 6 μm.

The main gate electrode 24 is provided in the main trench 20. The main gate electrode 24 is made of, for example, polysilicon including n-type impurities or p-type impurities. The main gate electrode 24 is electrically connected to the first gate electrode pad 111 by a wiring layer (not illustrated).

The gate insulating film 42 is provided between the main gate electrode 24 and the p-type base region 34. The gate insulating film 42 is, for example, a silicon oxide film.

The second n-type emitter region 37 is an $n^+$ semiconductor region. The second n-type emitter region 37 is provided in the cell end region 102. The second n-type emitter region 37 is provided between the first plane P1 and the p-type base region 34. The n-type impurity concentration of the second n-type emitter region 37 is higher than the n-type impurity concentration of the n-type drift region 32. For example, the second n-type emitter region 37 may have the same depth and n-type impurity concentration as the first n-type emitter region 36.

The second n-type emitter region 37 is electrically connected to the emitter electrode 12. The second n-type emitter region 37 comes into contact with the emitter electrode 12. The second n-type emitter region 37 functions as an electron supply source in a case in which the IGBT 100 is in an on state.

The control trench 22 is provided in the cell end region 102. The control trench 22 has, for example, a stripe shape that extends in the first direction substantially parallel to the first plane P1.

The control trench 22 penetrates through the p-type base region 34. The depth of the control trench 22 in the direction from the first plane P1 to the second plane P2 is, for example, equal to or less than 6 μm.

The control trench 22 may have the substantially same shape as the main trench 20. The control trenches 22 may be arranged at the same pitch as the main trenches 20.

The control gate electrode 26 is provided in the control trench 22. The control gate electrode 26 is made of, for example, polysilicon including n-type impurities or p-type impurities. The control gate electrode 26 is electrically connected to the second gate electrode pad 112 by a wiring layer (not illustrated).

The gate insulating film 42 is provided between the control gate electrode 26 and the p-type base region 34. The gate insulating film 42 is, for example, a silicon oxide film.

The p-type peripheral region 38 is a p-type semiconductor region. The p-type peripheral region 38 is provided in the termination region 103. The p-type peripheral region 38 is provided between the first plane P1 and the n-type drift region 32. For example, the p-type peripheral region 38 is provided so as to surround the cell region 101 and the cell end region 102. The p-type peripheral region 38 comes into contact with, for example, the p-type base region 34.

The depth of the p-type peripheral region 38 in the direction from the first plane P1 to the second plane P2 is greater than, for example, the depth of the p-type base region 34 in the direction from the first plane P1 to the second plane P2. The depth of the p-type peripheral region 38 in the direction from the first plane P1 to the second plane P2 is, for example, equal to or greater than 6 μm and equal to or less than 12 μm.

The p-type peripheral region 38 has a function of reducing field strength at the ends of the cell region 101 and the cell end region 102 in a case in which the IGBT 100 is in the off state.

The peripheral trench 44 is provided in the p-type peripheral region 38. The trench electrode 46 is provided in the peripheral trench 44. The trench electrode 46 is made of, for example, polysilicon inducing n-type impurities or p-type impurities. For example, the trench electrode 46 is floating. The gate insulating film 42 is provided between the trench electrode 46 and the p-type peripheral region 38. In addition, the peripheral trench 44 may be omitted.

The p-type guard ring region 40 is provided in the termination region 103. The p-type guard ring region 40 is provided between the first plane P1 and the n-type drift region 32. The p-type guard ring region 40 is provided so as to surround the cell region 101 and the cell end region 102. The p-type guard ring region 40 is floating. For example, the depth of the p-type guard ring region 40 in the direction from the first plane P1 to the second plane P2 is greater than the depth of the p-type base region 34 in the direction from the first plane P1 to the second plane P2.

The p-type guard ring region 40 has a function of reducing field strength at the ends of the cell region 101 and the cell end region 102 in a case in which the IGBT 100 is in the off state.

In the IGBT 100, the main gate electrode 24 in the cell region 101 is electrically separated from the control gate electrode 26 in the cell end region 102. The first gate voltage can be applied from the first gate electrode pad 111 to the main gate electrode 24. The second gate voltage can be applied from the second gate electrode pad 112 to the control gate electrode 26.

The first gate voltage and the second gate voltage can be applied with different timing. In addition, the first gate voltage and the second gate voltage may be different voltages.

Next, the operation of the IGBT 100 will be described.

In a case in which the IGBT 100 is in the off state, the emitter voltage is applied to the emitter electrode 12. The emitter voltage is, for example, 0 V. The collector voltage is applied to the collector electrode 14. The collector voltage is, for example, equal to or greater than 200 V and equal to or less than 6500 V.

In a case in which the IGBT 100 is turned on by a turn-on operation, a turn-on voltage is applied to the first gate electrode pad 111 and the second gate electrode pad 112. The turn-on voltage is also applied to the main gate electrode 24 and the control gate electrode 26.

Here, the turn-on voltage is a voltage higher than a threshold voltage of the transistors in the cell region 101 and the cell end region 102. The turn-on voltage is, for example, 15 V. Both the transistor in the cell region 101 and the transistor in the cell end region 102 are turned on.

Then, in a case in which the IGBT 100 is turned off by a turn-off operation, first, a turn-off voltage is applied to the second gate electrode pad 112. The turn-off voltage is also applied to the control gate electrode 26. Here, the turn-off voltage is a voltage that is equal to or lower than the threshold voltage at which the transistors in the cell region 101 and the cell end region 102 are not turned on and is, for example, 0 V. The transistor in the cell end region 102 is turned off before the transistor in the cell region 101 is turned off.

Then, the turn-off voltage is applied to the first gate electrode pad 111. The turn-off voltage is also applied to the main gate electrode 24. The transistor in the cell region 101 is turned off after the transistor in the cell end region 102 and the IGBT 100 is turned off. In the actual structure, the transistor in the cell region 101 is not clearly separated from the transistor in the cell end region 102. However, for convenience of description of the operation, it is assumed that the transistor in the cell region 101 and the transistor in the cell end region 102 are separated from each other.

Next, the function and effect of the semiconductor device according to the first embodiment will be described.

At the end of the cell region in which a cell is formed in the IGBT, carriers are spread to a portion of the termination region in which no cells are present in a case in which the cell is in an on state. During a turn-off operation for changing the cell from an on state to an off state, the spread carriers are concentrated on the cell close to the end of the cell region and are then discharged. Therefore, current density increases. As a result, there is a concern that destruction will occur in the IGBT. In addition, it takes a lot of time to discharge the carriers spread to the termination region and there is a concern that switching loss will increase during the turn-off operation.

Figure 3:
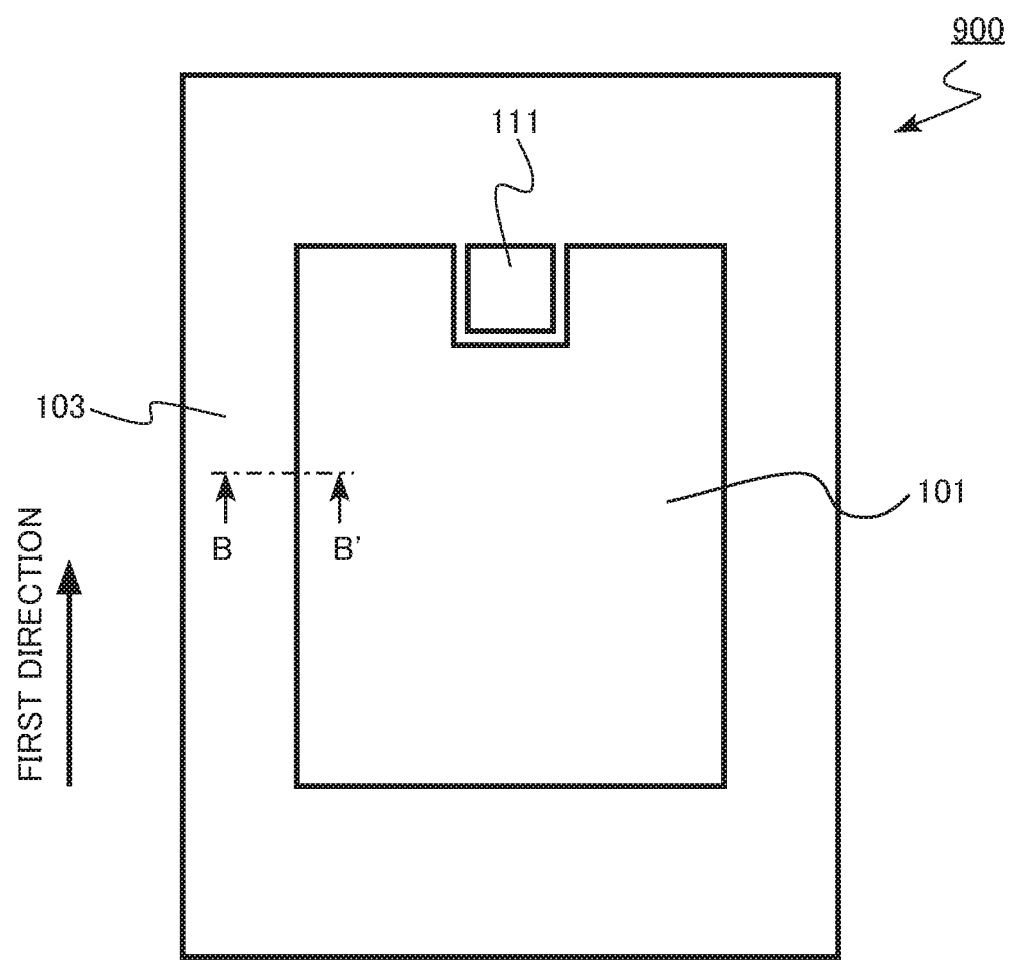
FIG. 3 is a plan view schematically illustrating a semiconductor device according to a comparative example.
Figure 4:
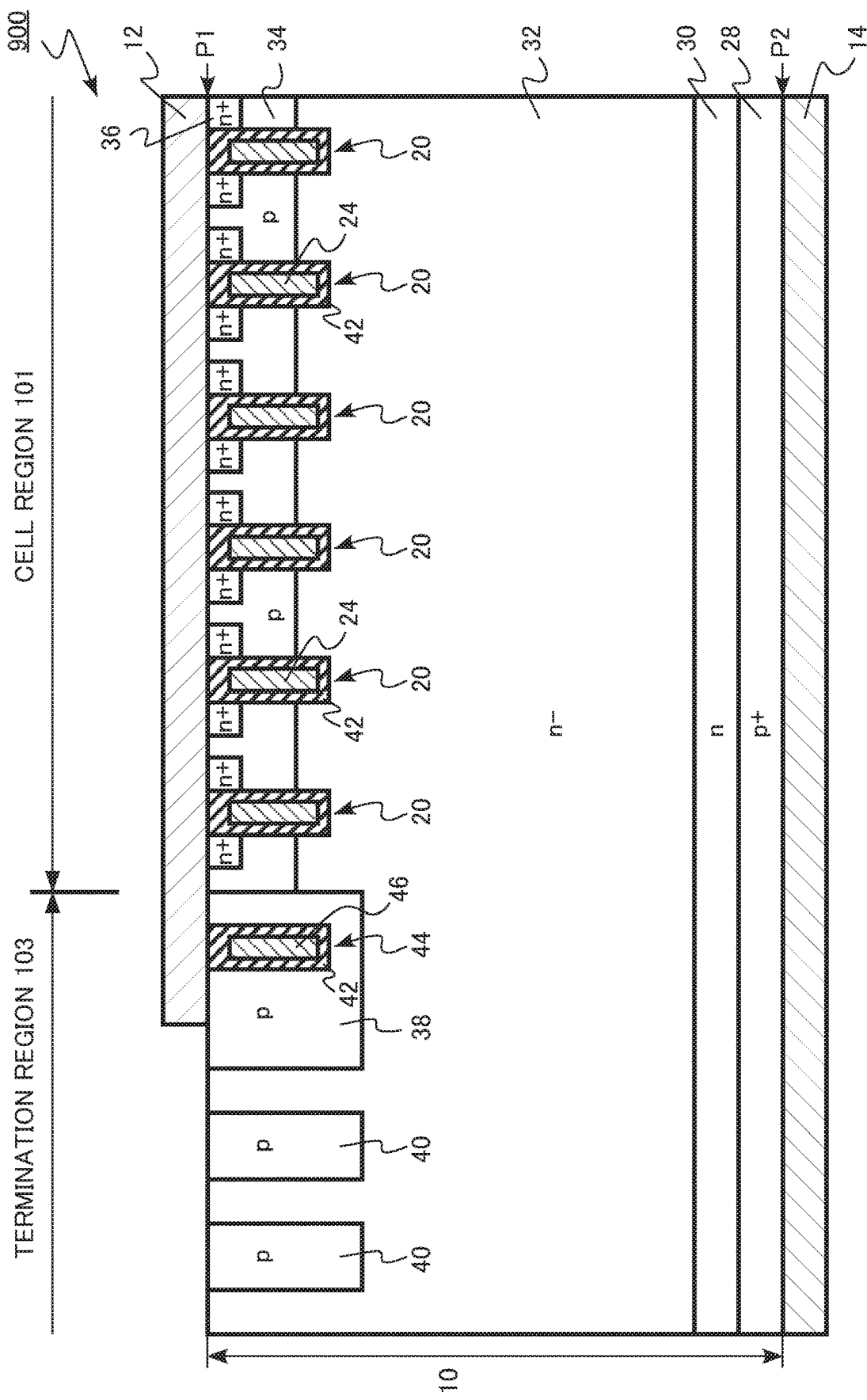
FIG. 4 is a cross-sectional view schematically illustrating the semiconductor device according to the comparative example.

FIG. 3 is a plan view schematically illustrating a semiconductor device according to a comparative example. FIG. 4 is a cross-sectional view schematically illustrating the semiconductor device according to the comparative example. FIG. 4 is a cross-sectional view taken along the line BB' of FIG. 3.

The semiconductor device according to the comparative example is a trench gate IGBT 900 in which a gate electrode is provided in a trench formed in a semiconductor layer.

The IGBT 900 according to the comparative example includes a cell region 101, a termination region 103, and a first gate electrode pad 111. The IGBT 900 includes a semiconductor layer 10, an emitter electrode 12, and a collector electrode 14.

The semiconductor layer 10 includes a main trench 20, a main gate electrode 24, a p-type collector region 28, an n-type buffer region 30, an n-type drift region 32, a p-type base region 34, a first n-type emitter region 36, a p-type peripheral region 38, a p-type guard ring region 40, a gate insulating film 42, a peripheral trench 44, and a trench electrode 46.

The IGBT 900 according to the comparative example differs from the IGBT 100 according to the first embodiment in that it does not include the cell end region 102 and the second gate electrode pad 112. In addition, the IGBT 900 according to the comparative example differs from the IGBT 100 according to the first embodiment in that it does not include the control trench 22, the control gate electrode 26, and the second n-type emitter region 37.

Figure 5:
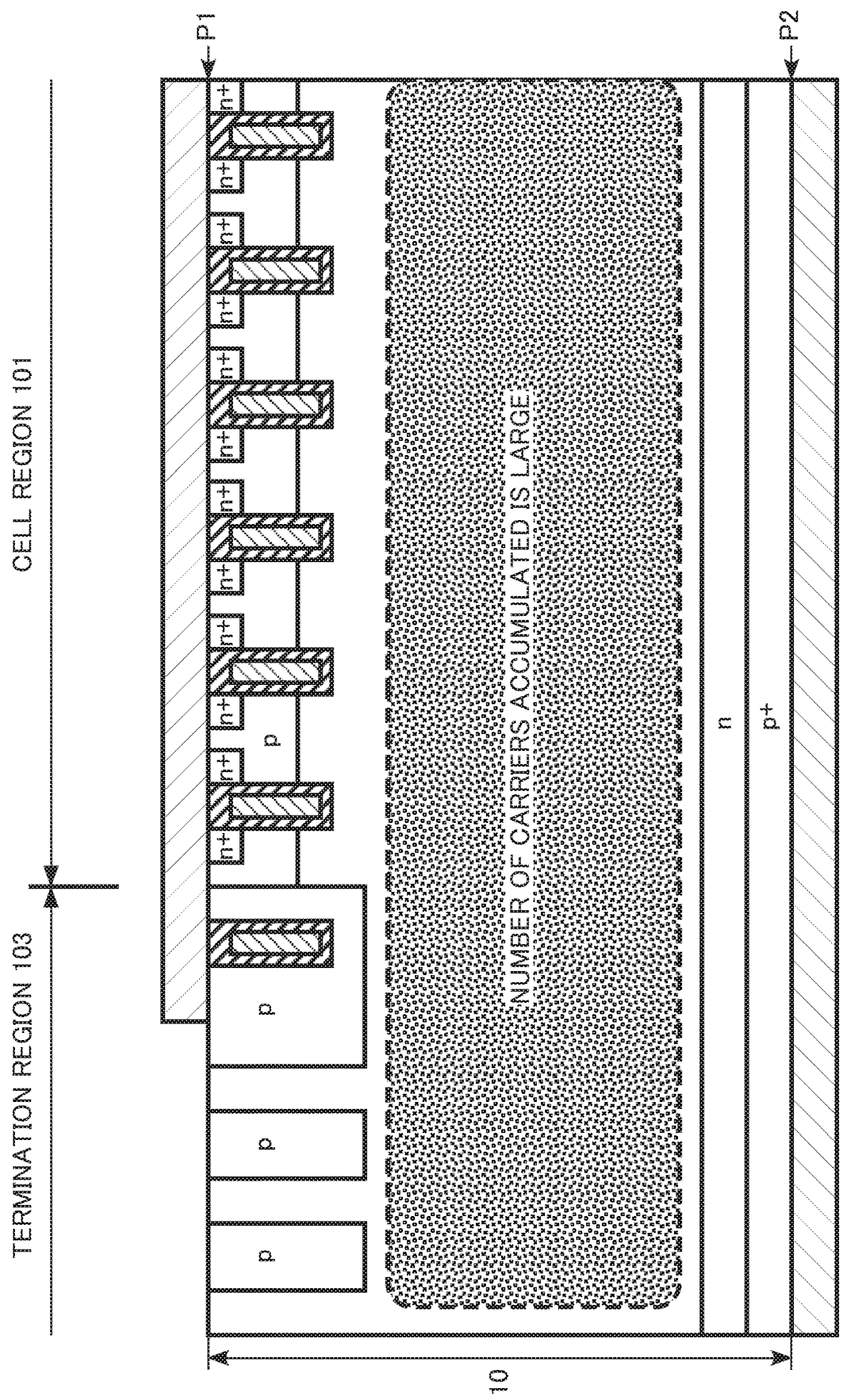
FIG. 5 is a diagram illustrating the function of the semiconductor device according to the comparative example.

FIG. 5 is a diagram illustrating the function of the semiconductor device according to the comparative example. FIG. 5 is a diagram illustrating a carrier accumulated state in a case in which the IGBT 900 according to the comparative example is in an on state.

As illustrated in FIG. 5, carriers are spread to the drift region 32 of the termination region 103 and a large number of carriers are accumulated in the drift region 32 of the termination region 103.

Figure 6:
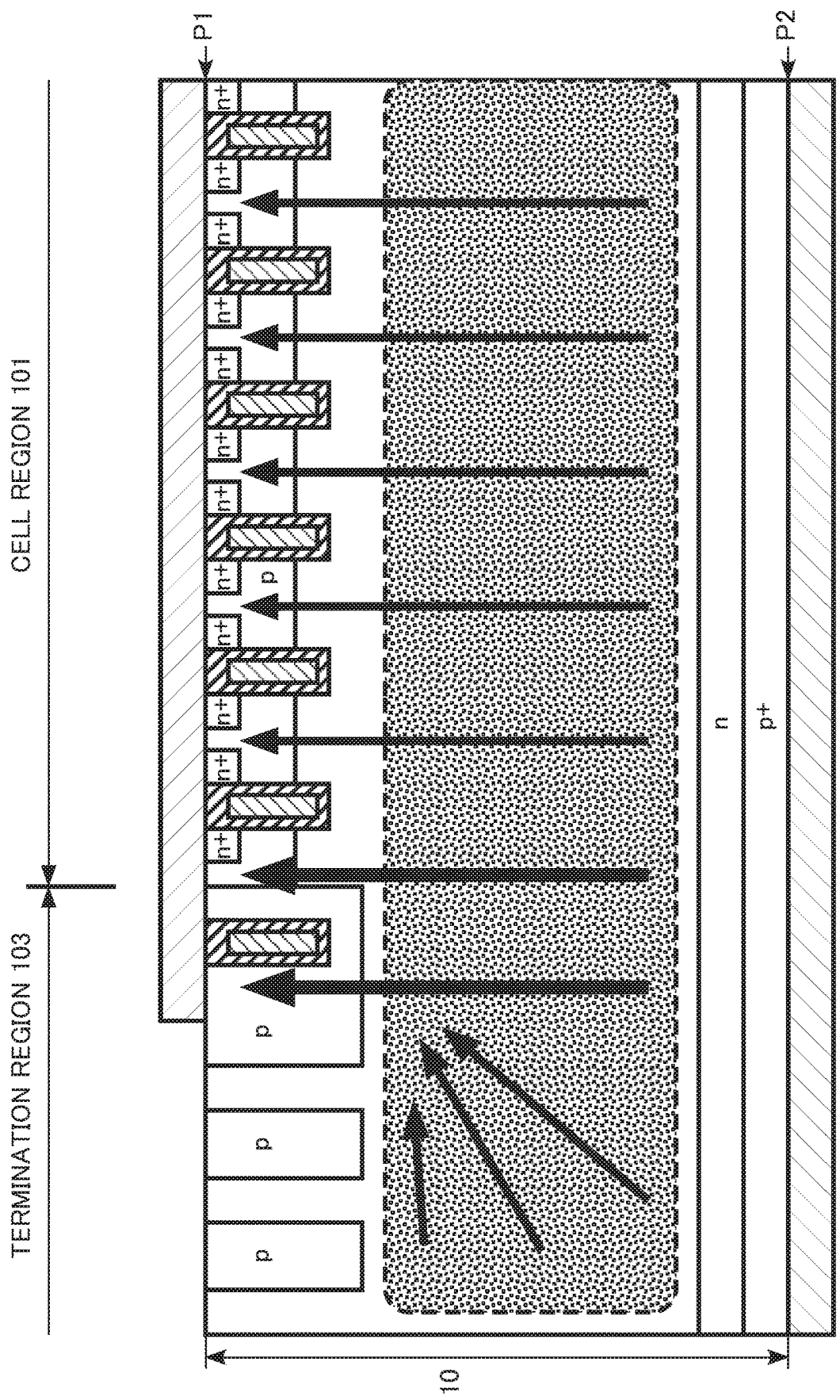
FIG. 6 is a diagram illustrating the function of the semiconductor device according to the comparative example.

FIG. 6 is a diagram illustrating the function of the semiconductor device according to the comparative example. FIG. 6 is a diagram illustrating the state of a current in a case in which the IGBT 900 according to the comparative example is turned off. An arrow indicates the flow of the current. The thickness of an arrow indicates current density. If the thickness is thick, the current density is large.

In the IGBT 900, in a case in which the turn-off voltage is applied to the main gate electrode 24 in the cell region 101, the transistors in the cell region 101 are turned off at the same time.

There is no carrier discharge path immediately above the drift region 32 of the termination region 103, particularly, above the p-type guard ring region 40. For this reason, a large number of carriers accumulated in the drift region 32 of the termination region 103 are concentrated on the end of the cell region 101. Therefore, the current density of the end of the cell region 101 increases. As a result, there is a concern that destruction will occur in the IGBT 900. Even if the IGBT 900 is not broken, it takes a lot of time to discharge the carriers and there is a concern that switching loss will increase during the turn-off operation.

Figure 7:
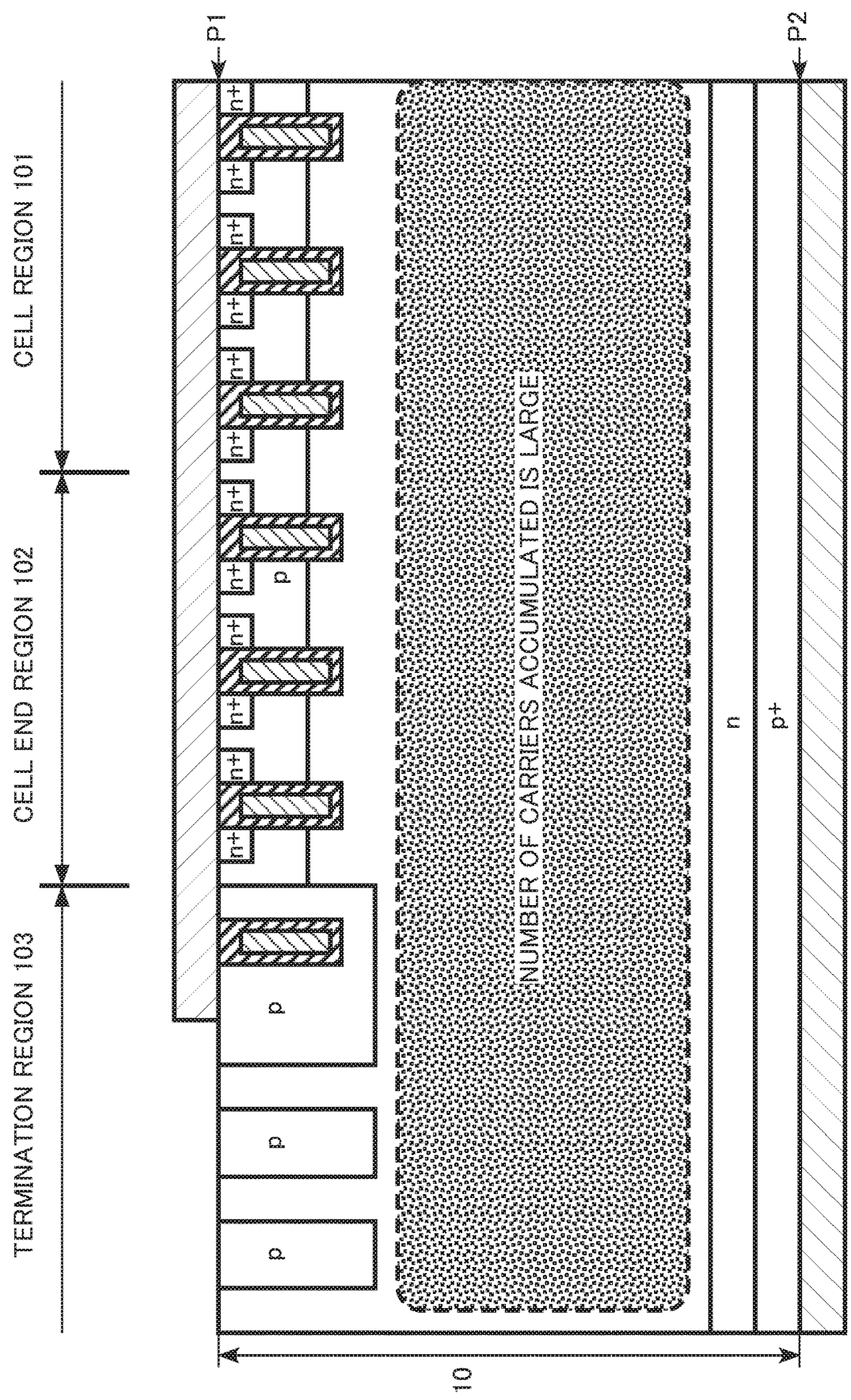
FIG. 7 is a diagram illustrating the function and effect of the semiconductor device according to the first embodiment.

FIG. 7 is a diagram illustrating the function and effect of the semiconductor device according to the first embodiment. FIG. 7 is a diagram illustrating a carrier accumulated state in a case in which the IGBT 100 according to the first embodiment is in an on state.

As illustrated in FIG. 7, carriers are spread to the drift region 32 of the termination region 103 and a large number of carriers are accumulated in the drift region 32 of the termination region 103 as in the comparative example.

Figure 8:
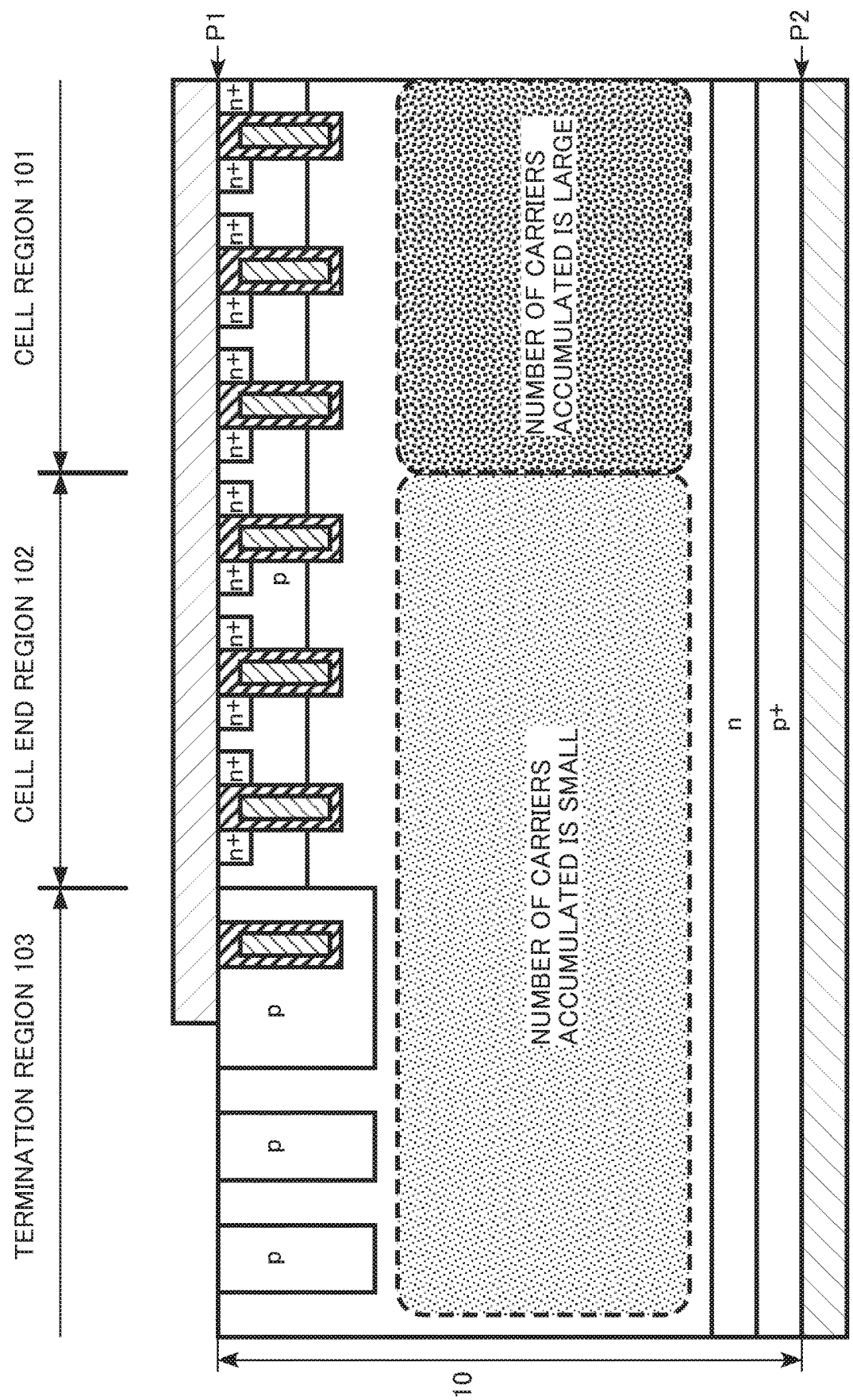
FIG. 8 is a diagram illustrating the function and effect of the semiconductor device according to the first embodiment.

FIG. 8 is a diagram illustrating the function and effect of the semiconductor device according to the first embodiment. FIG. 8 illustrates a carrier accumulated state in a case in which the transistor in the cell end region 102 is turned off before the transistor in the cell region 101 is turned off when the IGBT 100 according to the first embodiment is turned off.

Since the transistor in the cell end region 102 is in the off state, the injection of electrons in the cell end region 102 is blocked. Therefore, as illustrated in FIG. 8, the number of carriers accumulated in the termination region 103 and the cell end region 102 is less than the number of carriers accumulated in the cell region 101. However, since the cell region 101 is in the on state, the IGBT 100 is in the on state.

Figure 9:
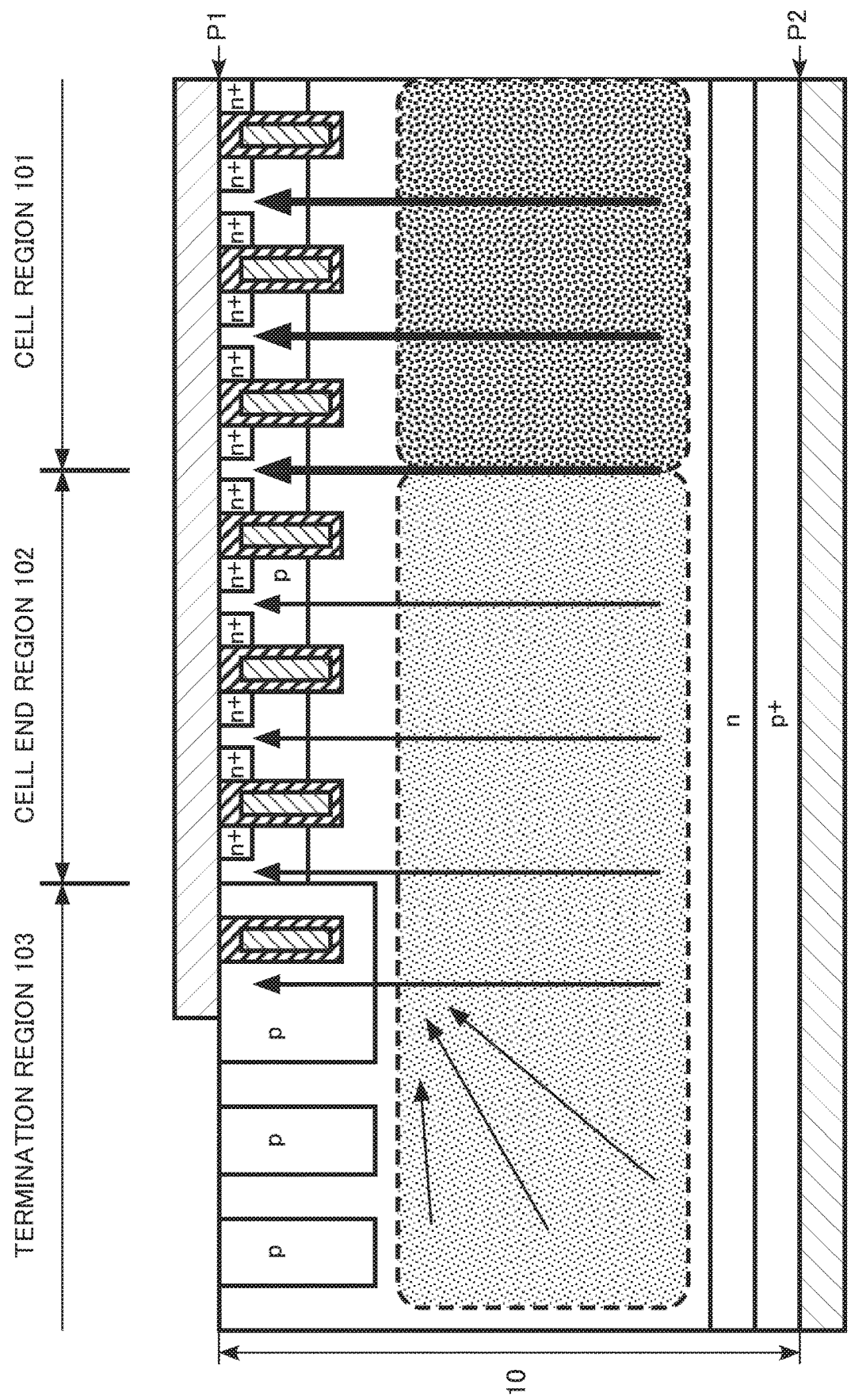
FIG. 9 is a diagram illustrating the function and effect of the semiconductor device according to the first embodiment.

FIG. 9 is a diagram illustrating the function and effect of the semiconductor device according to the first embodiment. FIG. 9 illustrates the state of a current in a case in which the IGBT 100 according to the first embodiment is turned off. An arrow indicates the flow of the current. The thickness of the arrow indicates current density.

In the IGBT 100, after the transistor in the cell end region 102 is turned off, the turn-off voltage is applied to the main gate electrode 24 in the cell region 101 to turn off the transistor in the cell region 101.

Since the number of carriers accumulated in the termination region 103 and the cell end region 102 has already been reduced, the concentration of the carriers at the end of the cell end region 102 or the cell region 101 does not occur. Therefore, current density does not increase. As a result, the destruction of the IGBT 100 is prevented. In addition, the time required to discharge the carriers is reduced and an increase in switching loss during the turn-off operation is prevented.

As described above, according to the first embodiment, it is possible to prevent the destruction of the IGBT 100 caused by current concentration. In addition, it is possible to prevent an increase in switching loss during the turn-off operation.

Second Embodiment

A semiconductor device according to a second embodiment differs from the semiconductor device according to the first embodiment in that a cell end region includes a third trench provided in the semiconductor layer and a third gate electrode which is provided in the third trench and is connected to the first gate electrode pad. Hereinafter, the description of a portion of the same content as that in the first embodiment will not be repeated.

Figure 10:
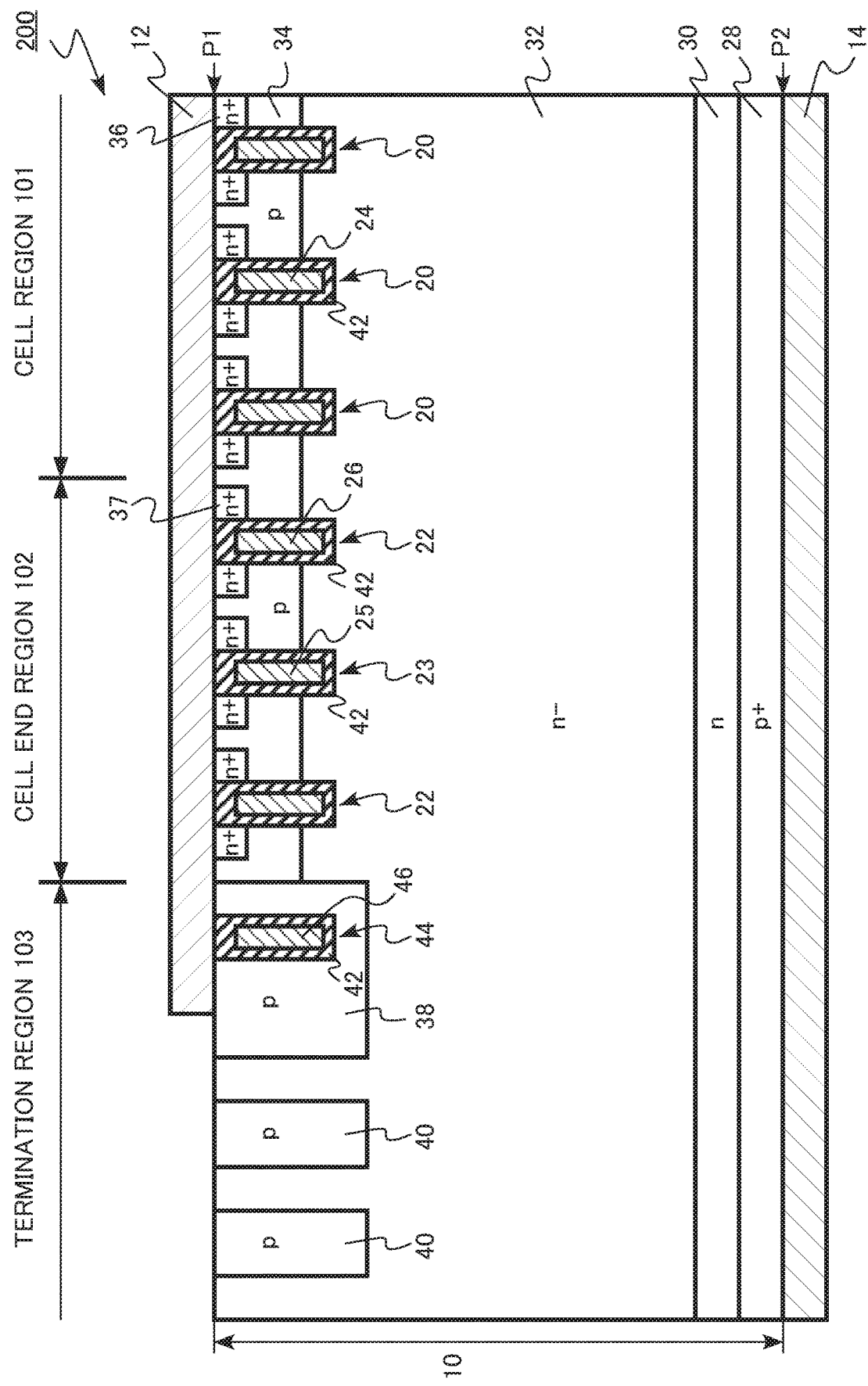
FIG. 10 is a cross-sectional view schematically illustrating a semiconductor device according to a second embodiment.

FIG. 10 is a cross-sectional view schematically illustrating the semiconductor device according to the second embodiment. FIG. 10 is a cross-sectional view corresponding to the cross-sectional view taken along the line AA' of FIG. 1.

The semiconductor device according to the second embodiment is a trench gate IGBT 200 in which a gate electrode is provided in a trench formed in a semiconductor layer.

The IGBT 200 according to the second embodiment includes a cell region 101, a cell end region 102, a termination region 103, a first gate electrode pad 111, and a second gate electrode pad 112. The IGBT 200 includes a semiconductor layer 10, an emitter electrode 12, and a collector electrode 14.

The semiconductor layer 10 includes a main trench 20 (first trench), a control trench 22 (second trench), a main gate electrode 24 (first gate electrode), a control gate electrode 26 (second gate electrode), a p-type collector region 28, an n-type buffer region 30, an n-type drift region 32, a p-type base region 34, a first n-type emitter region 36, a second n-type emitter region 37, a p-type peripheral region 38, a p-type guard ring region 40, a gate insulating film 42, a peripheral trench 44, and a trench electrode 46.

The semiconductor layer 10 further includes a main trench 23 (third trench) and a main gate electrode 25 (third gate electrode).

The main trench 23 and the main gate electrode 25 are provided in the cell end region 102. For example, the main trench 23 and the main gate electrode 25 are provided between two control trenches 22 in the cell end region 102.

The main gate electrode 25 is electrically connected to the first gate electrode pad 111. Therefore, a transistor having the same operation as a transistor in the cell region 101 is provided in a portion of the cell end region 102.

According to the IGBT 200 of the second embodiment, since a transistor having the same operation as the transistor in the cell region 101 is provided in the cell end region 102, it is possible to adjust the number of carriers accumulated in the termination region 103. Therefore, it is easy to optimize the characteristics of the IGBT 200.

As described above, according to the second embodiment, it is possible to prevent the destruction of the IGBT 200 caused by current concentration. In addition, it is possible to prevent an increase in switching loss during the turn-off operation. In addition, it is possible to easily optimize the characteristics of the IGBT 200.

In FIG. 10, the main trench 23 is disposed between the control trenches 22. However, the arrangement of the control trench 22 and the main trench 23 is variable.

Third Embodiment

A semiconductor device according to a third embodiment includes: a cell region including a p-type collector region that comes into contact with a collector electrode provided in a semiconductor layer, an n-type drift region provided between the p-type collector region and a first plane, a p-type base region provided between the n-type drift region and the first plane, and an n-type emitter region that is provided between the p-type base region and the first plane and comes into contact with an emitter electrode; and a cell end region including the p-type collector region, the n-type drift region, and a p-type region provided between the n-type drift region and the first plane.

The semiconductor device according to the third embodiment differs from the semiconductor device according to the first embodiment in that the emitter region is not provided in the cell end region. Hereinafter, the description of a portion of the same content as that in the first embodiment will not be repeated.

Figure 11:
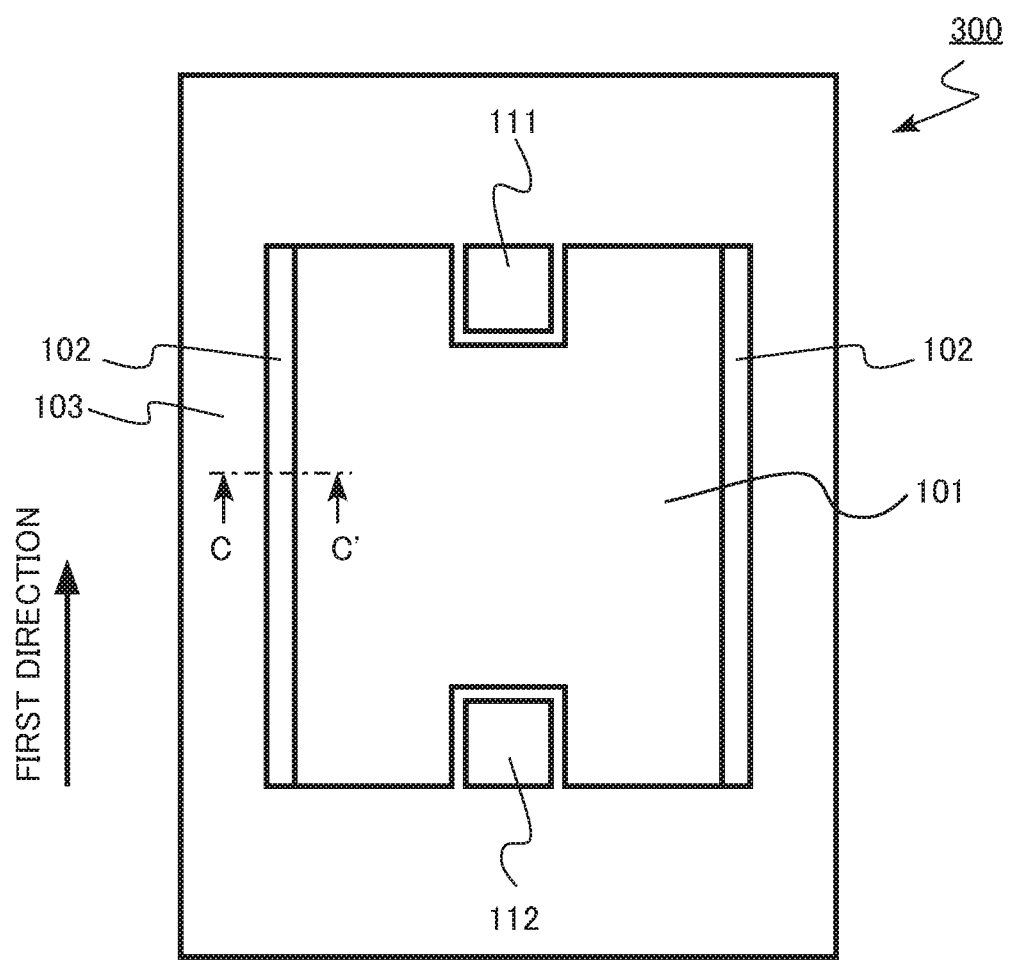
FIG. 11 is a plan view schematically illustrating a semiconductor device according to a third embodiment.
Figure 12:
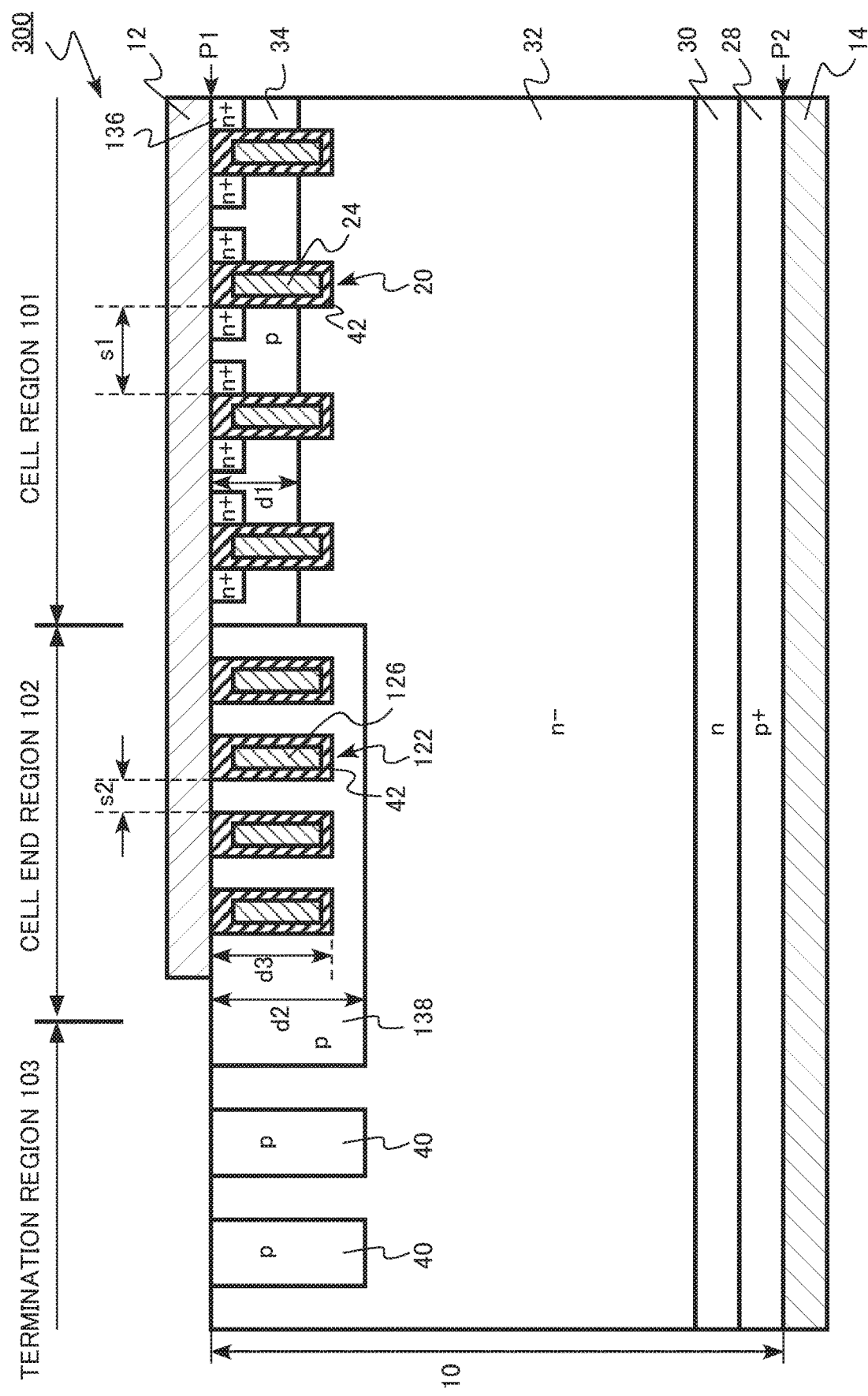
FIG. 12 is a cross-sectional view schematically illustrating the semiconductor device according to the third embodiment.

FIG. 11 is a plan view schematically illustrating the semiconductor device according to the third embodiment. FIG. 12 is a cross-sectional view schematically illustrating the semiconductor device according to the third embodiment. FIG. 12 is a cross-sectional view taken along the line CC' of FIG. 11.

The semiconductor device according to the third embodiment is a trench gate IGBT 300 in which a gate electrode is provided in a trench formed in a semiconductor layer.

The IGBT 300 according to the third embodiment includes a cell region 101, a cell end region 102, a termination region 103, a first gate electrode pad 111, and a second gate electrode pad 112. The IGBT 300 includes a semiconductor layer 10, an emitter electrode 12, and a collector electrode 14.

The semiconductor layer 10 includes a main trench 20 (first trench), a control trench 122 (second trench), a main gate electrode 24 (first gate electrode), a control gate electrode 126 (second gate electrode), a p-type collector region 28, an n-type buffer region 30, an n-type drift region 32, a p-type base region 34, an n-type emitter region 136, a p-type region 138 (first region), a p-type guard ring region 40, and a gate insulating film 42.

The first gate electrode pad 111 is provided on the first plane P1 of the semiconductor layer 10. The first gate electrode pad 111 is electrically connected to the main gate electrode 24 in the cell region 101. The first gate voltage is applied to the first gate electrode pad 111.

The second gate electrode pad 112 is provided on the first plane P1 of the semiconductor layer 10. The second gate electrode pad 112 is electrically connected to the control gate electrode 126 in the cell end region 102. The second gate voltage is applied to the second gate electrode pad 112.

The cell region 101 includes the emitter electrode 12, the collector electrode 14, the main trench 20, the main gate electrode 24, the p-type collector region 28, the n-type buffer region 30, the n-type drift region 32, the p-type base region 34, the n-type emitter region 136, and the gate insulating film 42. The cell region 101 has the same configuration as that in the IGBT 100 according to the first embodiment.

The cell end region 102 includes the emitter electrode 12, the collector electrode 14, the control trench 122, the control gate electrode 126, the p-type collector region 28, the n-type buffer region 30, the n-type drift region 32, the gate insulating film 42, and the p-type region 138. The n-type emitter region is not provided in the cell end region 102.

The termination region 103 includes the collector electrode 14, the p-type collector region 28, the n-type buffer region 30, the n-type drift region 32, and the p-type guard ring region 40.

The n-type emitter region 136 is an n$^+$ semiconductor region. The n-type emitter region 136 is provided in the cell region 101. The n-type emitter region 136 is provided between the first plane P1 and the p-type base region 34. The n-type impurity concentration of the n-type emitter region 136 is higher than the n-type impurity concentration of the n-type drift region 32.

The n-type emitter region 136 is electrically connected to the emitter electrode 12. The n-type emitter region 136 comes into contact with the emitter electrode 12. The n-type emitter region 136 functions as an electron supply source in a case in which the IGBT 300 is in an on state.

The main trench 20 is provided in the cell region 101. For example, the main trench 20 extends in the first direction that is substantially parallel to the first plane P1.

The main gate electrode 24 is provided in the main trench 20. The main gate electrode 24 is electrically connected to the first gate electrode pad 111 by a wiring layer (not illustrated).

The p-type region 138 is a p-type semiconductor region. The p-type region 138 is provided in the cell end region 102. The p-type region 138 is provided between the first plane P1 and the n-type drift region 32. For example, the p-type region 138 is provided so as to surround the cell region 101. The p-type region 138 comes into contact with the p-type base region 34. The p-type region 138 comes into contact with, for example, the emitter electrode 12.

The depth (d2 in FIG. 12) of the p-type region 138 in the direction from the first plane P1 to the second plane P2 is greater than, for example, the depth (d1 in FIG. 12) of the p-type base region 34 in the direction from the first plane P1 to the second plane P2. The depth d2 of the p-type region 138 in the direction from the first plane P1 to the second plane P2 is, for example, equal to or greater than 6 μm and equal to or less than 12 μm.

The control trench 122 is provided in the cell end region 102. For example, the control trench 22 extends in the first direction that is substantially parallel to the first plane P1.

The control trench 122 is provided in the p-type region 138. The depth (d3 in FIG. 12) of the control trench 22 in the direction from the first plane P1 to the second plane P2 is less than the depth d2 of the p-type region 138 in the direction from the first plane P1 to the second plane P2. The depth d3 of the control trench 22 in the direction from the first plane P1 to the second plane P2 is, for example, equal to or greater than 4 μm and equal to or less than 6 μm.

The distance (s2 in FIG. 12) between two adjacent control trenches 122 may be greater than or less than the distance (s1 in FIG. 12) between two adjacent main trenches 20. Alternatively, the distances nay be equal to each other.

The control gate electrode 126 is provided in the control trench 122. The control gate electrode 126 is electrically connected to the second gate electrode pad 112 by a wiring layer (not illustrated).

The gate insulating film 42 is provided between the control gate electrode 126 and the p-type region 138.

No transistors are formed in the cell end region 102 unlike the IGBT 100 according to the first embodiment.

Next, the operation of the IGBT 300 will be described.

In a case in which the IGBT 300 is in an off state, for example, the emitter voltage is applied to the emitter electrode 12. The emitter voltage is, for example, 0 V. The collector voltage is applied to the collector electrode 14. The collector voltage is, for example, equal to or greater than 200 V and equal to or less than 6500 V.

A turn-off voltage is applied to the first gate electrode pad 111 and the second gate electrode pad 112. The turn-off voltage is also applied to the main gate electrode 24 and the control gate electrode 126. The turn-off voltage is a voltage that is equal to or lower than the threshold voltage at which the transistor in the cell region 101 is not turned on and is, for example, 0 V.

In a case in which the IGBT 300 is turned on by a turn-on operation, a turn-on voltage is applied to the first gate electrode pad 111. The turn-on voltage is also applied to the main gate electrode 24.

The turn-on voltage is a voltage higher than the threshold voltage of the transistor in the cell region 101. The turn-on voltage is, for example, 15 V. The transistor in the cell region 101 is turned on. In addition, since no transistors are formed in the cell end region 102, a transistor operation does not occur in the cell end region 102.

Then, in a case in which the IGBT 300 is turned off by a turn-off operation, first, a negative potential is applied to the second gate electrode pad 112. The negative potential is also applied to the control gate electrode 126. A p-type accumulation layer is formed in the p-type region 138 around the control trench 122 in the cell end region 102.

Then, the turn-off voltage is applied to the first gate electrode pad 111. The turn-off voltage is also applied to the main gate electrode 24. The transistor in the cell region 101 is turned off and the IGBT 300 is turned off.

The negative potential nay be applied to the second gate electrode pad 112 at the same time as the turn-off voltage is applied to the first gate electrode pad 111. After the turn-off voltage is applied to the first gate electrode pad 111, the negative potential may be applied to the second gate electrode pad 112. After the negative potential is applied to the second gate electrode pad 112, the turn-off voltage may be applied to the first gate electrode pad 111.

Next, the function and effect of the semiconductor device according to the third embodiment will be described.

Figure 13:
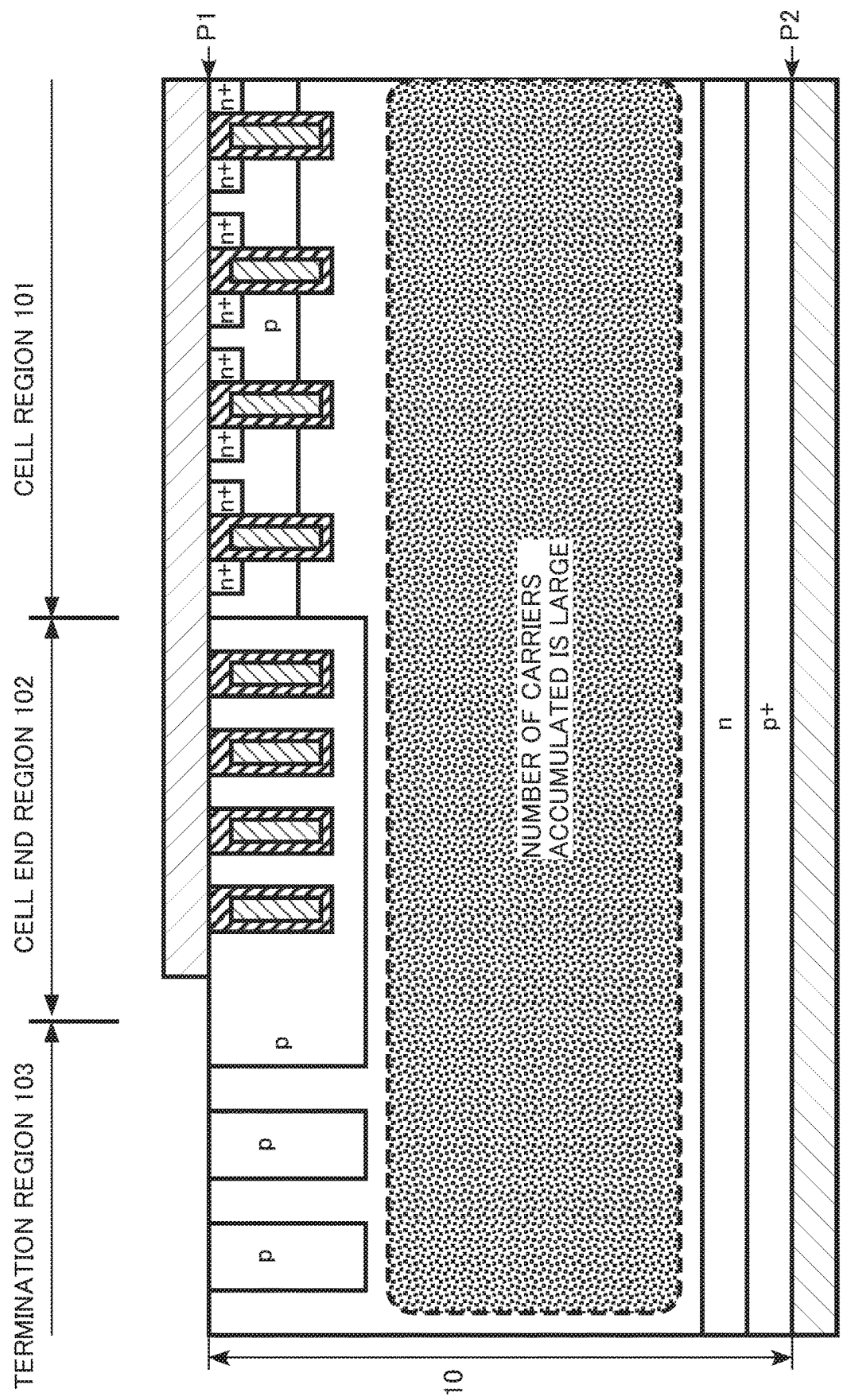
FIG. 13 is a diagram illustrating the function and effect of the semiconductor device according to the third embodiment.

FIG. 13 is a diagram illustrating the function and effect of the semiconductor device according to the third embodiment. FIG. 13 is a diagram illustrating a carrier accumulated state in a case in which the IGBT 300 according to the third embodiment is in an on state.

As illustrated in FIG. 13, carriers are spread to a portion of the termination region 103 and a large number of carriers are accumulated in a portion of the termination region 103.

Figure 14:
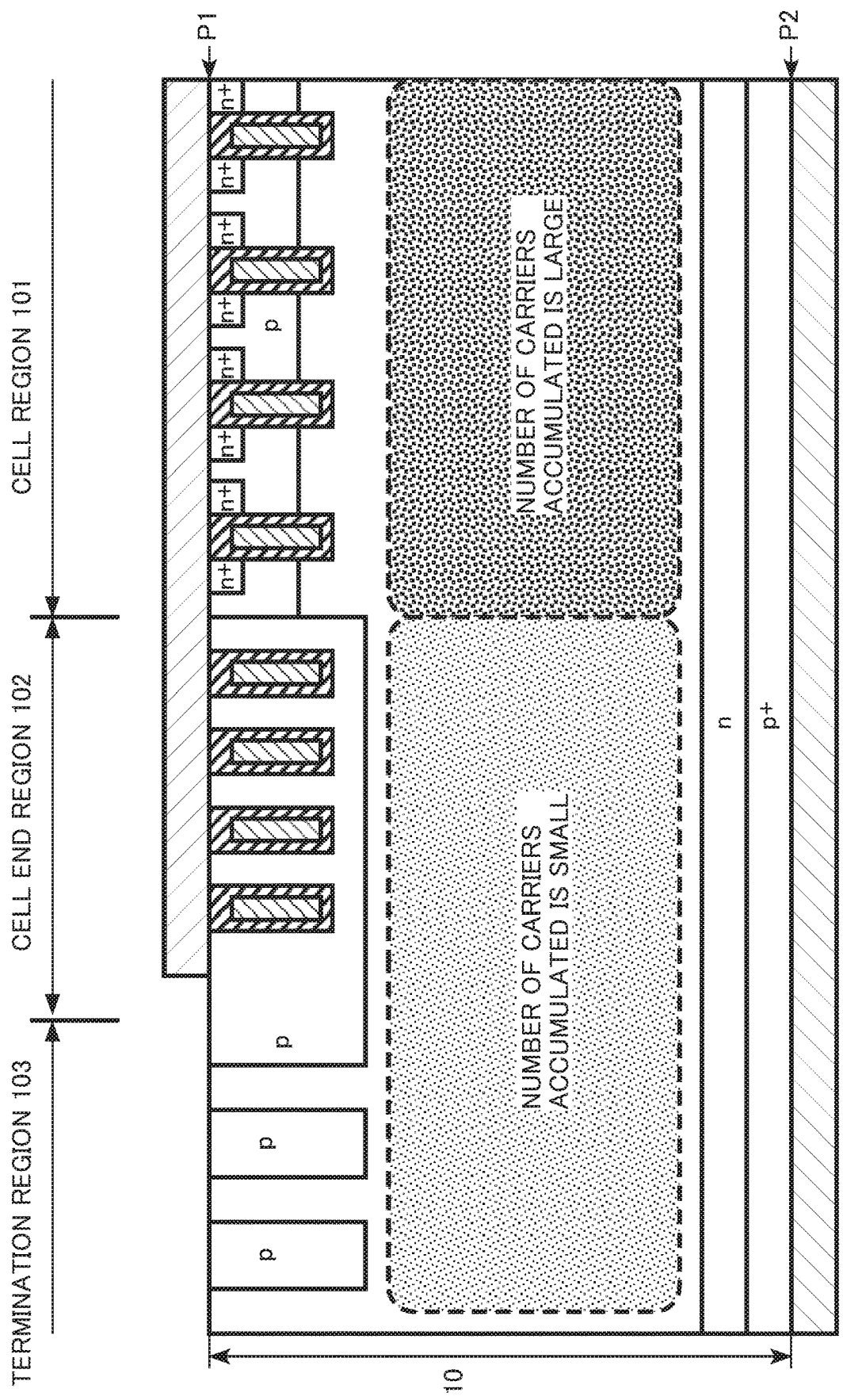
FIG. 14 is a diagram illustrating the function and effect of the semiconductor device according to the third embodiment.

FIG. 14 is a diagram illustrating the function and effect of the semiconductor device according to the third embodiment. FIG. 14 illustrates the accumulation of carriers in a state in which the negative voltage is applied to the control gate electrode 126 in the cell end region 102 to form a p-type accumulation layer in the p-type region 138 in the IGBT 300 according to the third embodiment.

The formation of the p-type accumulation layer in the p-type region 138 accelerates the discharge of the carries from the cell end region 102. Therefore, as illustrated in FIG. 14, the number of carriers accumulated in the termination region 103 and the cell end region 102 is less than the number of carries accumulated in the cell region 101.

Figure 15:
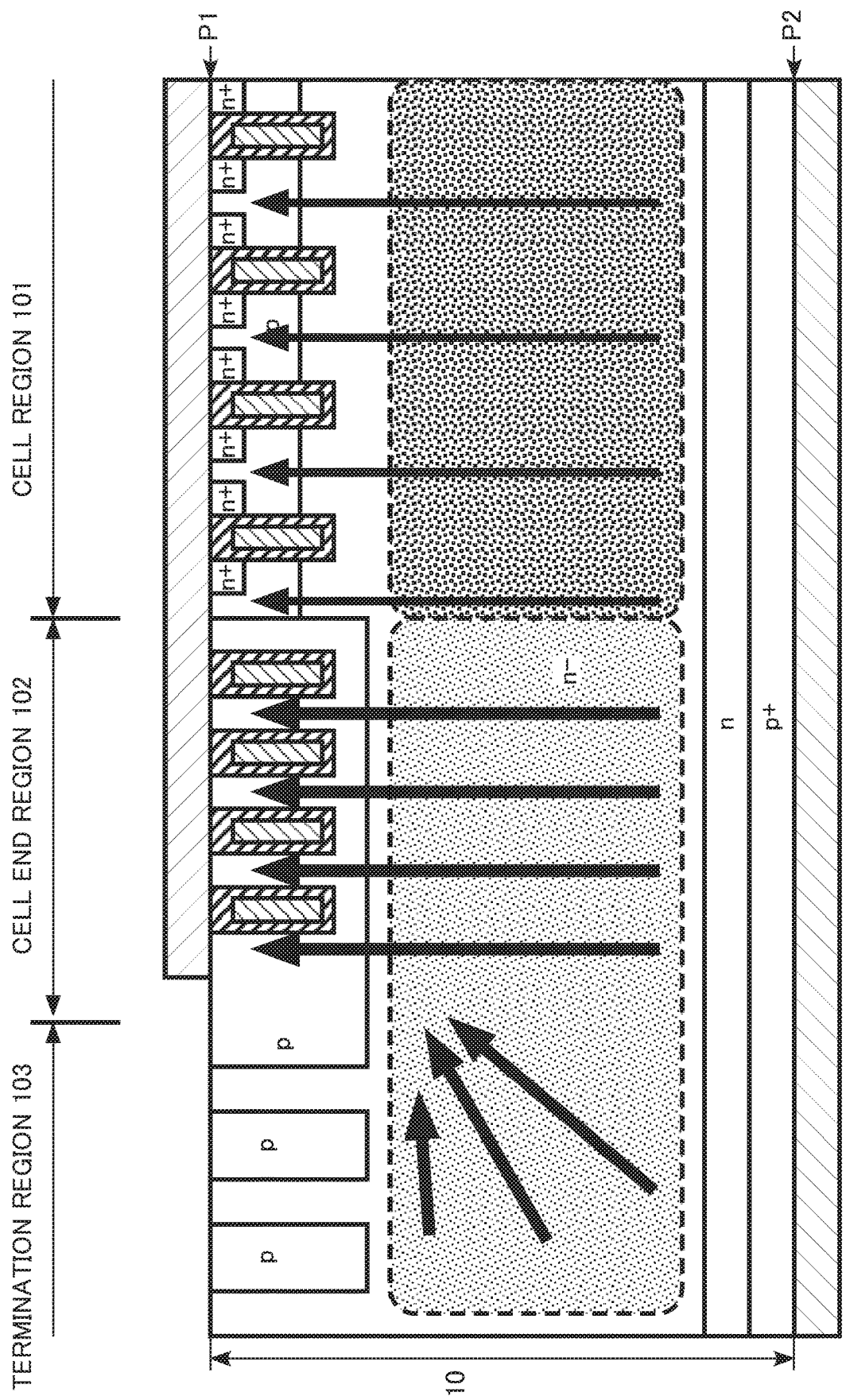
FIG. 15 is a diagram illustrating the function and effect of the semiconductor device according to the third embodiment.

FIG. 15 is a diagram illustrating the function and effect of the semiconductor device according to the third embodiment. FIG. 15 is a diagram illustrating the state of a current in a case in which the IGBT 300 according to the third embodiment is turned off. An arrow indicates the flow of the current. The thickness of the arrow indicates current density.

In the IGBT 300, the negative potential is applied to the control gate electrode 126 to form the p-type accumulation layer in the p-type region 138 of the cell end region 102. The turn-off voltage is applied to the main gate electrode 24 of the cell region 101 and the transistor in the cell region 101 is turned off.

Since the p-type accumulation layer is formed in the p-type region 138, the carriers are effectively discharged from the cell end region 102. Therefore, the carries are not concentrated on the cell end region 102 or the end of the cell region 101. As a result, current density does not increase. The destruction of the IGBT 300 is prevented. In addition, the time required to discharge the carriers is reduced and an increase in switching loss during the turn-off operation is prevented.

It is preferable that the distance s2 between two adjacent control trenches 122 be less than the distance s1 between two adjacent main trenches 20 in order to form a large number of p-type accumulation layers in the p-type region 138.

As described above, according to the third embodiment, it is possible to prevent the destruction of the IGBT 300 caused by current concentration. In addition, it is possible to prevent an increase in switching loss during the turn-off operation.

Fourth Embodiment

A semiconductor device according to a fourth embodiment differs from the semiconductor device according to the third embodiment in that an n-type region is provided between two adjacent second trenches. Hereinafter, the description of a portion of the same content as that in the third embodiment will not be repeated.

Figure 16:
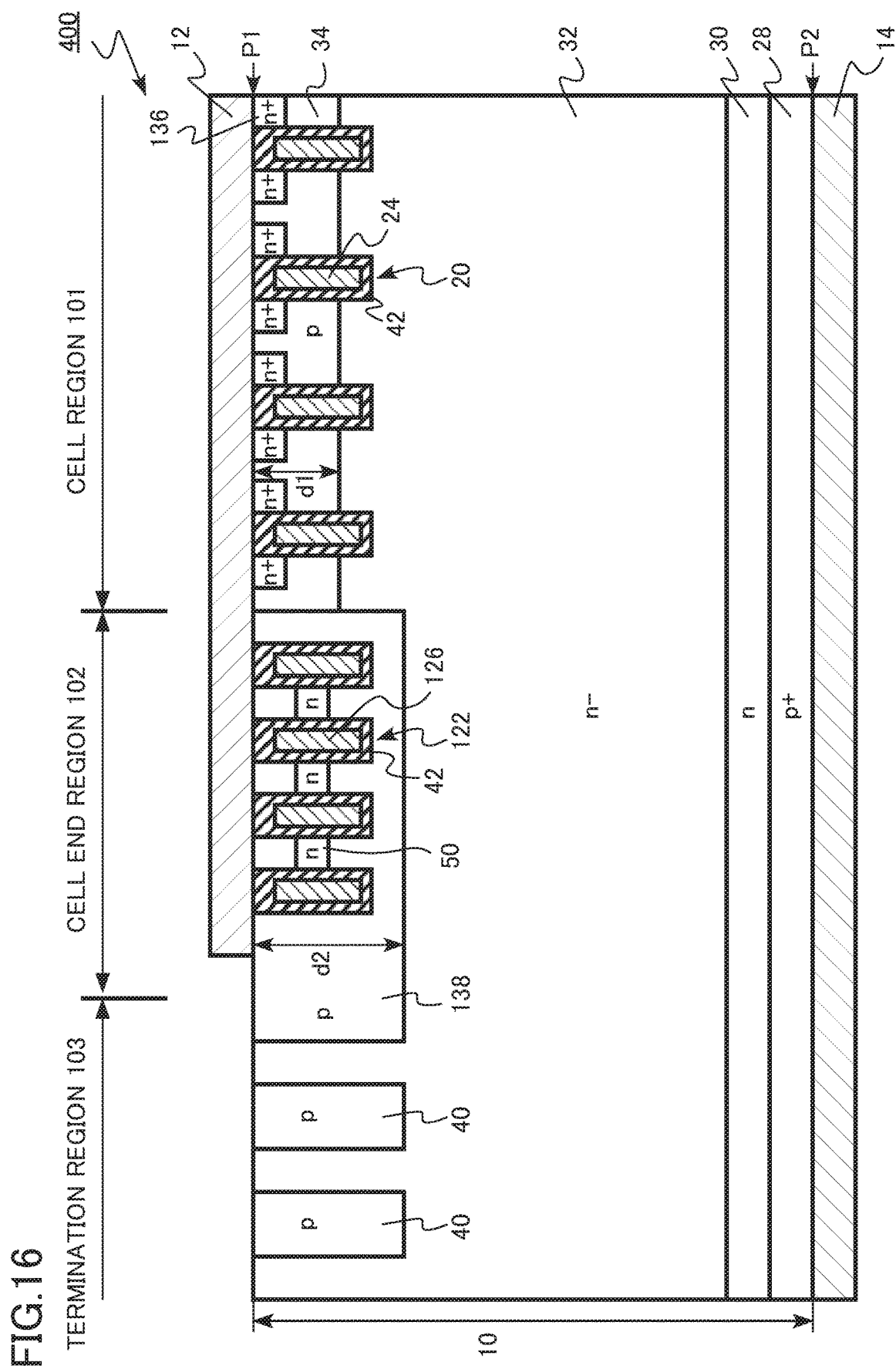
FIG. 16 is a cross-sectional view schematically illustrating a semiconductor device according to a fourth embodiment.

FIG. 16 is a cross-sectional view schematically illustrating the semiconductor device according to the fourth embodiment. FIG. 16 is a cross-sectional view corresponding to the cross-sectional view taken along the line CC' of FIG. 11.

The semiconductor device according to the fourth embodiment is a trench gate IGBT 400 in which a gate electrode is provided in a trench formed in a semiconductor layer.

The IGBT 400 according to the fourth embodiment includes a cell region 101, a cell end region 102, a termination region 103, a first gate electrode pad 111, and a second gate electrode pad 112. The IGBT 400 includes a semiconductor layer 10, an emitter electrode 12, and a collector electrode 14.

The semiconductor layer 10 includes a main trench 20 (first trench), a control trench 122 (second trench), a main gate electrode 24 (first gate electrode), a control gate electrode 126 (second gate electrode), a p-type collector region 28, an n-type buffer region 30, an n-type drift region 32, a p-type base region 34, an n-type emitter region 136, a p-type region 138, a p-type guard ring region 40, a gate insulating film 42, and an n-type region 50 (second-conductivity-type region).

The n-type region 50 is provided in the cell end region 102. The n-type region 50 is an n-type semiconductor region. The n-type region 50 is provided between two control trenches 122. The upper and lower sides of the n-type region 50 come into contact with the p-type region 138.

A p-channel metal oxide field effect transistor (MOSFET) having the control gate electrode 126 as the gate electrode is formed in the cell end region 102 by the formation of the n-type region 50 in a pseudo manner. The n-type region 50 functions as a channel region of the p-channel MOSFET.

Next, the operation of the IGBT 400 will be described.

In a case in which the IGBT 400 is in an off state, for example, the emitter voltage is applied to the emitter electrode 12. The emitter voltage is, for example, 0 V. The collector voltage is applied to the collector electrode 14. The collector voltage is, for example, equal to or greater than 200 V and equal to or less than 6500 V.

A turn-off voltage is applied to the first gate electrode pad 111. The turn-off voltage is also applied to the main gate electrode 24.

In a case in which the IGBT 400 is turned on by a turn-on operation, a turn-on voltage is applied to the first gate electrode pad 111. The turn-on voltage is also applied to the main gate electrode 24. A voltage of 0 V or the same voltage as that applied to the main gate electrode 24 is applied to the control gate electrode 126.

The turn-on voltage is a voltage higher than the threshold voltage of the transistor in the cell, region 101. The turn-on voltage is, for example, 15 V. The transistor in the cell region 101 is turned on. In addition, the p-channel MOSFET formed in the cell end region 102 is in an off state. Therefore, the discharge of carries in the cell end region 102 is prevented.

Then, in a case in which the IGBT 400 is turned off by a turn-off operation, a negative potential is applied to the second gate electrode pad 112. The negative potential is applied to the control gate electrode 126. Therefore, a p-type accumulation layer is formed in the p-type region 138 around the control trench 122 in the cell end region 102. In addition, the p-channel MOSFET formed in the cell end region 102 is turned on.

A turn-off voltage is applied to the first gate electrode pad 111. The turn-off voltage is also applied to the main gate electrode 24. The transistor in the cell region 101 is turned off and the IGBT 400 is turned off.

In a case in which the IGBT 400 is in the on state, similarly to the third embodiment, carries are also spread to a portion of the termination region 103 and a large number of carriers are accumulated in a portion of the termination region 103. The p-channel MOSFET formed in the cell end region 102 is in an off state. Therefore, the discharge of the carriers in the cell end region 102 is prevented. As a result, on-resistance is less than that in the third embodiment.

In a case in which a negative voltage is applied to the control trench 122 in the cell end region 102 to turn off the IGBT 400, a p-type accumulation layer is formed in the p-type region 138. In addition, the p-channel MOSFET formed in the cell end region 102 is turned on.

In a case in which the p-channel MOSFET is turned on and the p-type accumulation layer is formed in the p-type region 138, the carries are discharged from the cell end region 102. Therefore, the number of carriers accumulated in the termination region 103 and the cell end region 102 is less than the number of carriers accumulated in the cell region 101.

The turn-off voltage is applied to the main gate electrode 24 in the cell region 101 and the transistor in the cell region 101 is turned off. Since the number of carriers accumulated in the termination region 103 and the cell end region 102 has already been reduced, the carries are not concentrated on the cell end region 102 or the end of the cell region 101. Therefore, current density does not increase. As a result, the destruction of the IGBT 400 is prevented. In addition, the time required to discharge the carriers is reduced and an increase in switching loss during the turn-off operation is prevented.

As described above, according to the fourth embodiment, it is possible to prevent the destruction of the IGBT 400 caused by current concentration. In addition, it is possible to prevent an increase in switching loss during the turn-off operation. Furthermore, on-resistance is less than that in the third embodiment. The turn-off voltage may be applied to the first gate electrode pad 111 at the same time as the negative potential is applied to the second gate electrode pad 112.

Fifth Embodiment

A semiconductor device according to a fifth embodiment differs from the semiconductor device according to the third embodiment in that the depth of the p-type region in the direction from the first plane to the second plane is less than the depth of the second trench in the direction and the depth of the p-type region in the direction from the first plane to the second plane is substantially equal to the depth of the p-type base region in the direction from the first plane to the second plane. Hereinafter, the description of a portion of the same content as that in the third embodiment will not be repeated.

Figure 17:
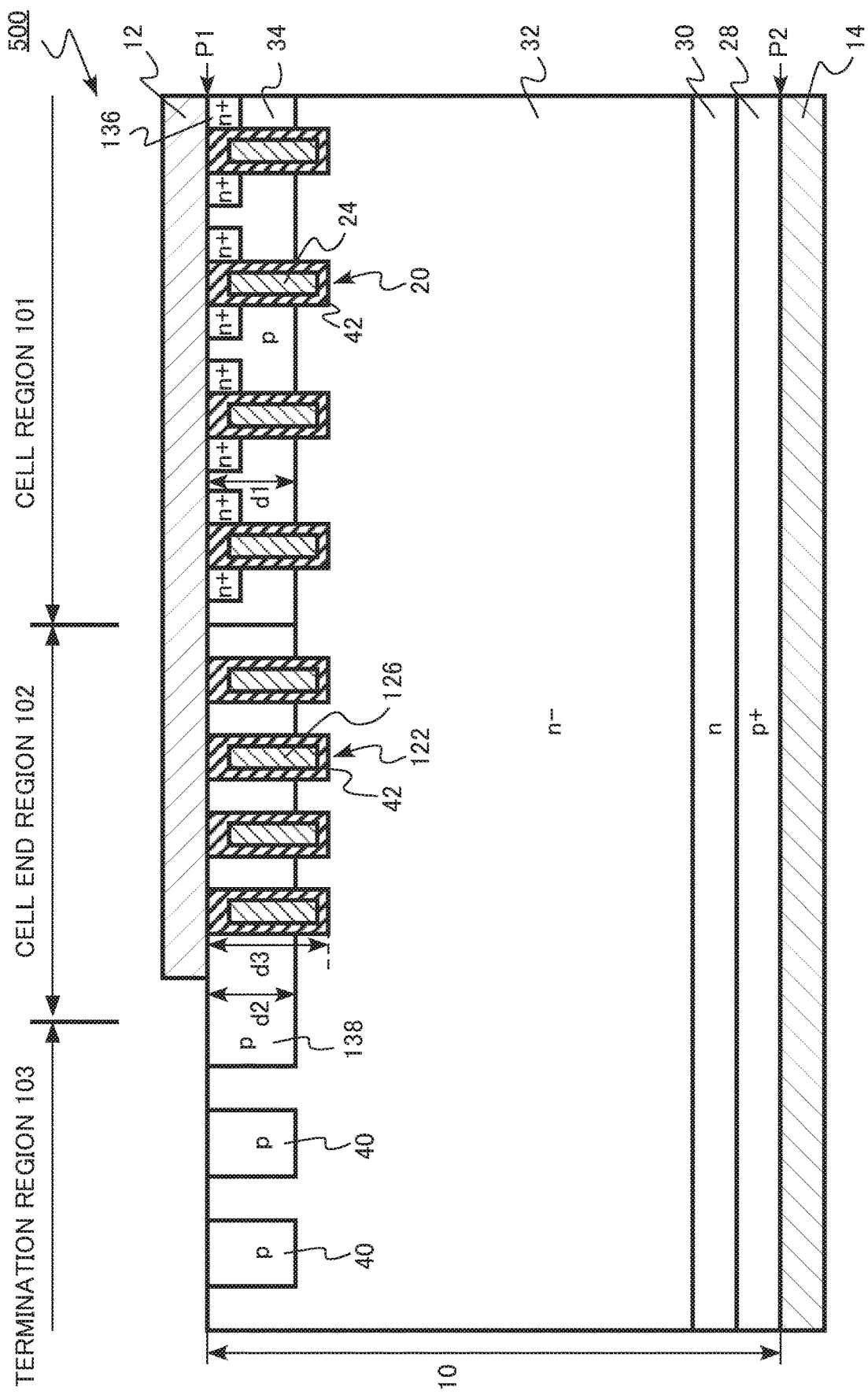
FIG. 17 is a cross-sectional view schematically illustrating a semiconductor device according to a fifth embodiment.

FIG. 17 is a cross-sectional view schematically illustrating the semiconductor device according to the fifth embodiment. FIG. 37 is a cross-sectional view corresponding to the cross-sectional view taken along the line CC' of FIG. 11.

The semiconductor device according to the fifth embodiment is a trench gate IGBT 500 in which a gate electrode is provided in a trench formed in a semiconductor layer.

The IGBT 500 according to the fifth embodiment includes a cell region 101, a cell end region 102, a termination region 103, a first gate electrode pad 111, and a second gate electrode pad 112. The IGBT 500 includes a semiconductor layer 10, an emitter electrode 12, and a collector electrode 14.

The semiconductor layer 10 includes a main trench 20 (first trench), a control trench 122 (second trench), a main gate electrode 24 (first gate electrode), a control gate electrode 126 (second gate electrode), a p-type collector region 28, an n-type buffer region 30, an n-type drift region 32, a p-type base region 34, an n-type emitter region 136, a p-type region 138, a p-type guard ring region 40, and a gate insulating film 42.

The depth (d2 in FIG. 17) of the p-type region 138 in the direction from the first plane P1 to the second plane P2 is less than the depth (d3 in FIG. 17) of the control trench 122 (d3 in FIG. 17) in the direction from the first plane P1 to the second plane P2. The control trench 122 penetrates through the p-type region 138 and reaches the n-type drift region 32.

In addition, the depth d2 of the p-type region 138 in the direction from the first plane P1 to the second plane P2 is substantially equal to the depth (d1 in FIG. 17) of the p-type base region 34 in the direction from the first plane P1 to the second plane P2.

The depth of the p-type guard ring region 40 in the direction from the first plane P1 to the second plane P2 is substantially equal to the depth d1 of the p-type base region 34 in the direction from the first plane P1 to the second plane P2.

In the IGBT 500 according to the fifth embodiment, the control trench 122 penetrates through the p-type region 138. Therefore, the discharge of carriers from the cell end region 102 in a case in which a p-type accumulation layer is formed in the p-type region 138 around the control trench 122 is accelerated. As a result, the destruction of the IGBT 500 is further prevented. In addition, the time required to discharge the carriers is further reduced and an increase in switching loss during the turn-off operation is prevented.

In the IGBT 500, the depth of the p-type region 138 or the p-type guard ring region 40 is less than that in the IGBT 300 according to the third embodiment. Therefore, for example, a long-term thermal process for diffusing p-type impurities is not required. As a result, it is possible to manufacture an IGBT at a low cost. In addition, for example, it is easy to integrate the IGBT and a logic device or a memory device that is manufactured by a low-temperature process into the same chip.

As described above, according to the fifth embodiment, it is possible to further prevent the destruction of the IGBT 500 caused by current concentration. In addition, it is possible to further prevent an increase in switching loss during the turn-off operation. Further, it is possible to manufacture the IGBT at a low cost. It is easy to integrate the IGBT and a logic device or a memory device into the same chip.

In the first to fifth embodiments, the case in which the semiconductor layer is made of single-crystal silicon has been described. However, the material forming the semiconductor layer is not United to the single-crystal silicon. For example, the semiconductor layer may be made of other single-crystal semiconductors such as single-crystal silicon carbide.

In the first to fifth embodiments, the case in which two to four control trenches are provided in the cell end region has been described. However, the number of control trenches may be, for example, 5 or more.

In the first to fifth embodiments, the case in which the main trench or the control trench has a stripe shape has been described. However, the shape of the main trench or the control trench is not particularly limited. For example, the main trench or the control trench may have other shapes such as a mesh shape.

In the first to fifth embodiments, the structure including the p-type guard ring region has been described as an example of the termination region. However, the termination region may have other structures. For example, the termination region may have a structure having a field plate.

In the first, to fifth embodiments, the case in which the first conductivity type is a p type and the second conductivity type is an n type has been described. However, the first conductivity type may be an n type and the second conductivity type may be a p type.

While certain embodiments have been described, these embodiments have been presented by way of example only, and are not intended to limit the scope of the inventions. Indeed, the semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor layer having a first plane and a second plane opposite to the first plane;
   an emitter electrode provided on a side of the first plane of the semiconductor layer;
   a collector electrode provided on a side of the second plane of the semiconductor layer;
   a first gate electrode pad provided on the side of the first plane of the semiconductor layer;
   a second gate electrode pad provided on the side of the first plane of the semiconductor layer, the second gate electrode pad being electrically separated from the emitter electrode;
   a cell region including at least one first trench provided in the semiconductor layer and a first gate electrode provided in the at least one first trench, the first gate electrode being electrically connected to the first gate electrode pad;
   a cell end region including at least one second trench provided in the semiconductor layer and a second gate electrode provided in the at least one second trench, the second gate electrode being electrically connected to the second gate electrode pad, the cell end region being adjacent to the cell region; and
   a termination region provided around the cell region and the cell end region, the cell end region provided between the termination region and the cell region.

2. The semiconductor device according to claim 1, wherein the cell region includes:
   a collector region of first-conductivity-type provided in the semiconductor layer, the collector region being in contact with the collector electrode;
   a drift region of second-conductivity-type provided between the collector region and the first plane;
   a base region of the first-conductivity-type provided between the drift region and the first plane; and
   a first emitter region of the second-conductivity-type provided between the base region and the first plane, the first emitter region being in contact with the emitter electrode, and
   the cell end region includes:
   the collector region;
   the drift region;
   the base region; and
   a second emitter region of the second-conductivity-type provided between the base region and the first plane, the second emitter region being in contact with the emitter electrode.

3. The semiconductor device according to claim 1, wherein the cell end region includes at least one third trench provided in the semiconductor layer and a third gate electrode provided in the at least one third trench, and
   the third gate electrode is electrically connected to the first gate electrode pad.

4. The semiconductor device according to claim 1, wherein, during a transition from an on state in which a voltage equal to or higher than a threshold voltage is applied to the first gate electrode pad and the second gate electrode pad to an off state, after a voltage equal to or lower than the threshold voltage is applied to the second gate electrode pad, the voltage equal to or lower than the threshold voltage is applied to the first gate electrode pad.

5. The semiconductor device according to claim 1, wherein the cell region includes:
   a collector region of first-conductivity-type provided in the semiconductor layer, the collector region being in contact with the collector electrode;
   a drift region of second-conductivity-type provided between the collector region and the first plane;
   a base region of the first-conductivity-type provided between the drift region and the first plane; and
   an emitter region of the second-conductivity-type provided between the base region and the first plane, the emitter region being in contact with the emitter electrode, and
   the cell end region includes:
   the collector region;
   the drift region; and
   a first region of the first-conductivity-type provided between the drift region and the first plane.

6. The semiconductor device according to claim 5, wherein a distance between two adjacent trenches of the at least one second trench is less than a distance between two adjacent trenches of the at least one first trench.

7. The semiconductor device according to claim 5, wherein a depth of the first region in a direction from the first plane to the second plane is greater than a depth of the at least one second trench in the direction.

8. The semiconductor device according to claim 5, wherein a second region of the second-conductivity-type is provided between two adjacent trenches of the at least one second trench.

9. The semiconductor device according to claim 5, wherein a depth of the first region in a direction from the first plane to the second plane is less than a depth of the at least one second trench in the direction.

10. The semiconductor device according to claim 9, wherein the depth of the first region in the direction is substantially equal to the depth of the base region in the direction.

11. The semiconductor device according to claim 5, wherein, during a transition from an on state in which a voltage equal to or higher than a threshold voltage is applied to the first gate electrode pad to an off state, after a negative voltage is applied to the second gate electrode pad, the voltage equal to or lower than the threshold voltage is applied to the first gate electrode pad.

12. The semiconductor device according to claim 1, wherein the cell end region is adjacent to the termination region.

13. The semiconductor device according to claim 1, wherein the termination region surrounds the cell region and the cell end region.

14. The semiconductor device according to claim 1, wherein the cell end region includes a first portion and a second portion, the first portion is adjacent to one end of the cell region, and the second portion is adjacent to an opposite end of the cell region.

15. The semiconductor device according to claim 14, wherein a width of the cell region in a direction from the first portion to the second portion is wider than a width of the first portion in the direction and a width of the second portion in the direction.

16. The semiconductor device according to claim 1, wherein the at least one second trench includes two second trenches adjacent to each other.

* * * * *